(12) United States Patent
Michinaka et al.

(10) Patent No.: US 8,686,601 B2
(45) Date of Patent: Apr. 1, 2014

(54) POWER CONVERSION APPARATUS FOR VEHICLE USE

(75) Inventors: Takuya Michinaka, Chiyoda-ku (JP);
Satoshi Ishibashi, Chiyoda-ku (JP);
Masaru Kobayashi, Chiyoda-ku (JP);
Haruyuki Matsuo, Chiyoda-ku (JP);
Yuji Kuramoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 461 days.

(21) Appl. No.: 12/853,731

(22) Filed: Aug. 10, 2010

(65) Prior Publication Data
US 2011/0181105 A1    Jul. 28, 2011

(30) Foreign Application Priority Data
Jan. 22, 2010   (JP) ................................. 2010-011836

(51) Int. Cl.
*H05K 7/14* (2006.01)
(52) U.S. Cl.
USPC ........... 307/149; 307/9.1; 307/10.1; 361/702; 361/704
(58) Field of Classification Search
USPC ................................................ 307/9.1, 10.1
See application file for complete search history.

(56) References Cited

U.S. PATENT DOCUMENTS

| | | | | |
|---|---|---|---|---|
| 7,745,952 | B2* | 6/2010 | Nakatsu et al. | 307/9.1 |
| 7,817,421 | B2* | 10/2010 | Nagatomo et al. | 361/697 |
| 7,965,510 | B2* | 6/2011 | Suzuki et al. | 361/699 |
| 2002/0190374 | A1* | 12/2002 | Nakajima et al. | 257/707 |
| 2006/0096299 | A1* | 5/2006 | Mamitsu et al. | 62/3.2 |
| 2006/0232942 | A1* | 10/2006 | Nakatsu et al. | 361/710 |
| 2006/0284308 | A1 | 12/2006 | Harada et al. | |

FOREIGN PATENT DOCUMENTS

| | | |
|---|---|---|
| DE | 102005023659 A1 | 12/2005 |
| JP | 08-149795 A | 6/1996 |
| JP | 11-121691 A | 4/1999 |
| JP | 2001-168278 A | 6/2001 |
| JP | 2002-095268 A | 3/2002 |
| JP | 2004-104860 A | 4/2004 |
| JP | 2004-266973 A | 9/2004 |

(Continued)

OTHER PUBLICATIONS

Japanese Office Action, dated Aug. 14, 2012, issued in corresponding Japanese Application No. 2010-011836.

(Continued)

*Primary Examiner* — Rexford Barnie
*Assistant Examiner* — Toan Vu
(74) *Attorney, Agent, or Firm* — Sughrue Mion, PLLC

(57) ABSTRACT

A power conversion apparatus for vehicle use having a small size and a light weight is obtained. The power conversion apparatus is provided with: a plurality of semiconductor modules in which semiconductor devices are molded with a resin, and each of which has a module body, an input terminal, and an output terminal; a heat sink of a rectangular parallelepiped shape which has cooling principal planes on opposite surfaces thereof, respectively, for cooling these semiconductor modules; and a plurality of control boards which control the driving of the semiconductor modules. Each of the semiconductor modules is arranged such that its module body has a principal plane in surface contact with one of the cooling principal planes of the heat sink, and each of the control boards is arranged in opposition to a surface of the module body at an opposed side of the principal plane thereof.

11 Claims, 22 Drawing Sheets

(56) References Cited

FOREIGN PATENT DOCUMENTS

| | | |
|---|---|---|
| JP | 2005-73374 A | 3/2005 |
| JP | 2005-354864 A | 12/2005 |
| JP | 2008-004667 A | 1/2008 |
| JP | 2008-004953 A | 1/2008 |
| JP | 2008-103577 A | 5/2008 |
| JP | 2008245451 A | 10/2008 |
| JP | 2009-100514 A | 5/2009 |

OTHER PUBLICATIONS

German Office Action dated Sep. 23, 2013 issued in corresponding German Patent Application No. 102010036058.9.

\* cited by examiner (a) (b)

POWER CONVERSION APPARATUS FOR VEHICLE USE

BACKGROUND OF THE INVENTION

1. Field of the Invention

The present invention relates in particular to a power conversion apparatus for vehicle use which is adapted to be supplied to a traction motor, a motor for power generation, etc., used in a hybrid vehicle, an electric vehicle or the like.

2. Description of the Related Art

In the past, as a drive control apparatus of an electric rotating machine which is an electric power source, there has been used a power conversion apparatus that is provided with a semiconductor module and a control board for controlling the driving, protection, etc., of a semiconductor switching device which is a component element of the semiconductor module.

The power conversion apparatus includes an inverter that serves to convert a direct current power into an alternating current power, and a DC-DC converter that serves to convert a direct current power of a certain voltage into another direct current power of a different voltage, wherein a simple inverter, a simple DC-DC converter, a combined unit of these inverter and converter, etc., have been put into practical use.

As such a conventional power conversion apparatus, there has been known one in which a plurality of semiconductor modules each having a semiconductor chip received in an envelope composed of a base and an insulating package are arranged on a common heat sink with its top surface of a flat shape (see a first prior art reference Japanese patent application laid-open No. 2001-168278 (paragraph Nos. 0018, 0027, 0028 and 0034)).

Each semiconductor module of this first prior art reference is constructed such that a semiconductor chip of an insulated gate bipolar transistor (IGBT) and a diode are connected in parallel to each other, wherein a plurality of main terminals (large current conducting terminals) each having a through hole for a conductor mounting bolt formed therethrough are arranged in parallel to the base so as to protrude outwardly of the package.

In addition, signal terminals (gate terminals) are arranged on the opposite side of the main terminals across the package. Each semiconductor module is fixedly secured to the heat sink by means of mounting bolts which pass through mounting holes formed in four corners of the base.

Moreover, six semiconductor modules are used as the semiconductor modules so as to form a three-phase inverter which acts as a power conversion apparatus, and mounting bolts are caused to penetrate through the corresponding main terminals of each semiconductor module, which are then electrically joined to conductors (bus bars), thereby forming wiring for an inverter main circuit.

Further, as another conventional power conversion apparatus, there has been know one in which a plurality of semiconductor modules each have a semiconductor chip received therein, similar to the semiconductor modules in the above-mentioned first prior art reference, wherein main terminals and signal terminals are arranged so as to protrude from an insulating package of a module body of each semiconductor module in opposite directions different substantially 180 degrees from each other, with a pair of radiator plates being exposed to the opposite sides, respectively, of a principal plane (from which no terminals protrude and which has a relatively large area) of the package (see a second prior art reference Japanese patent application laid-open No. 2005-73374 (paragraph Nos. 0011 and 0017-0024)).

A plurality of semiconductor modules in this second prior art reference are held side by side between a pair of refrigerant tubes which function as heat sinks. The main terminals protruded from the package of each semiconductor module are electrically joined to conductors (bus bars) that are arranged on a plane substantially perpendicular to the principal plane of the package, and have wiring formed thereon as a main circuit of the power conversion apparatus.

In addition, at a side at which the signal terminals protrude, a control board is arranged substantially at right angles with respect to the principal plane of the package, and control circuit components on the control board and the signal terminals of the semiconductor modules are electrically connected with each other by inserting the signal terminals into a plurality of connection holes formed in the control board.

However, in the power conversion apparatus of the first prior art reference, as shown in FIG. 5 to be described later, the plurality of semiconductor modules are arranged on the same plane, so the outside size of the power conversion apparatus is increased, as a result of which there has been a problem that the cost and weight of the power conversion apparatus as a product increase.

That is, in the first prior art reference, the respective semiconductor modules are arranged on the common heat sink in a planar manner, so the heat sink is made larger in size in accordance with the number of the semiconductor modules to be used.

In addition, since the semiconductor modules are fixedly secured to the heat sink by means of the mounting bolts passing through the mounting holes formed in the four corners of the base, it is necessary to secure a space for arranging the mounting holes, as a result of which the installation project area of the semiconductor modules themselves spreads or increases.

Further, the heat sink is composed of a metallic material due to its cooling capability and its structural strength requirement, so the weight of the heat sink increases to a remarkable extent due to the increased size of the heat sink.

In addition, in the power conversion apparatus of the second prior art reference, it is formed such that each of the semiconductor modules is held between and by a pair of refrigerant tubes (or heat sinks), and the conductors (bus bars) are arranged at the side at which the main terminals of the semiconductor modules are protruded, and the control board is arranged at the side at which the signal terminals are protruded.

Since the plurality of semiconductor modules and heat sinks are stacked or laminated to form a three dimensional shape, the project areas of the semiconductor modules and the heat sinks can be made smaller as compared with those in the conventional power conversion apparatus disclosed in the first prior art reference. Thus, in cases where the power conversion apparatus has high output capacity, it can be achieved by arranging a multitude of laminated units of semiconductor modules and heat sinks in a lamination direction.

However, in the power conversion apparatus of the second prior art reference, wirings of the conductors are arranged at one side and the other side of the semiconductor modules in a collected manner, and the signal terminals are also arranged at the other side of the semiconductor modules in a collected manner, as shown in FIGS. 7(*a*) and 7(*b*) to be described later, so there have been problems that it is difficult to adjust the proportions of individual installation volumes or spaces required by the main terminals, the conductor wiring parts, the semiconductor modules, the heat sinks, and the control board, and that the assembly efficiency thereof is low.

In particular, in cases where extremely thin type heat sinks are applied as the heat sinks, the distance between adjacent signal terminals projected from adjacent semiconductor modules located in a line on opposite sides of each heat sink becomes shorter, but on the other hand, the size of the control board components remains unchanged, and the area of the control board can not be reduced, so the volume enveloping the whole of the main terminals, the conductor wiring parts, the semiconductor modules, the heat sinks, and the control board is not necessarily reduced.

In addition, in cases where a multitude of semiconductor modules and heat sinks are stacked or laminated in order to obtain a power conversion apparatus of large-capacity output, the difference between the length in the lamination direction and the long side length of the rectangular control board becomes shorter, so the above-mentioned problem in connection with the adjustment of the proportions of the installation volumes or spaces can be alleviated to some extent.

However, in cases where the output of the power conversion apparatus may be small and the number of laminations of the semiconductor modules and heat sinks may also be small, i.e., for the power conversion apparatus which should be essentially achieved with a small size, the above-mentioned problem is not still solved.

In addition, in the second prior art reference, the arrangement of the signal terminals of the semiconductor modules becomes substantially perpendicular to the magnetic field generated in accordance with the operation of the semiconductor modules, so it is considered that the magnetic flux generated from the semiconductor modules interlinks with the signal terminals, thereby causing a malfunction in the control of the semiconductor modules. Therefore, the implementation of noise countermeasures is needed, which results in problems such as an increase in the number of component parts required, a rise in cost, etc.

In order to make the power conversion apparatus small-sized, it is desirable that each of the heat sinks, the semiconductor modules and the control board be made small in size and light in weight.

However, the miniaturization of the apparatus can not be achieved only due to the reduction in the size thereof.

As an example of restrictions on this, it is necessary to secure an insulation distance in a portion to which a high voltage is applied to generate a high potential difference.

In order for the power conversion apparatus to operate normally, it is necessary to prevent a leakage of current and a dielectric breakdown, and technical specifications to be applied are prescribed, for example, by International Standard IEC 60950 (Information technology equipment-safety), Japanese Industrial Standards JIS C5014 (Multilayer Printed Wiring Boards), JIS D5305-3 (Electric road vehicles-Safety specifications-part 3: Protection of persons against electric hazards), etc.

Based on these, in cases where there is a potential difference between the electrodes of electrically conductive patterns and/or electronic parts which are exposed outside on the control board, it is necessary to arrange them at a predetermined distance therebetween, i.e., to provide a predetermined creepage distance or a predetermined spatial clearance.

For example, the brocking voltage of the semiconductor modules is selected according to the operating voltage of the power conversion apparatus, and there are 1,200 V, 1,800 V, etc., for the brocking voltage. In cases where the insulation distance of the control board is designed based on the voltage value of this brocking voltage, the creepage distance at a potential difference of 1,200 V amounts to about 6 mm, and that at a potential difference of 1,800 V also amounts to about 9 mm, as shown in FIG. 29.

With respect to this, in the power conversion apparatus of the second prior art reference, even if the heat sinks and the semiconductor modules can be formed to be thin in thickness, as shown in FIG. 7($b$) to be described later, the signal terminals protruded from the semiconductor modules have a potential difference according to the operating voltage range of the power conversion apparatus, so the electrically conductive patterns and the electronic parts have to be arranged in such a manner that the electric conductive patterns on the control board, the electrodes of the electronic parts, electrically connected to the signal terminals and the like can secure a creepage distance corresponding to the potential difference.

Accordingly, even in cases where thin heat sinks are applied, the volume enveloping the entire power conversion apparatus is not reduced to a sufficient extent, and the signal terminals protruded from the semiconductor modules have to be bent so as to secure a creepage distance on the control board, thus giving rise to problems such as the addition of processing, the rise of costs, etc.

Further, in the second prior art reference, the fixed connection of the control board with the semiconductor modules and the heat sinks requires the fixing thereof by means of a structural member of high rigid, separately from the connection thereof by the signal terminals of low rigidity, and hence a holding structural member is provided which has a strength capable of suppressing vibration of the control board, as a result of which there are also problems such as an increase in the weight of the apparatus and a deterioration of assembling workability.

SUMMARY OF THE INVENTION

The present invention is intended to solve such problems as referred to above, and has for its object to obtain a power conversion apparatus for vehicle use which is made small in size and light in weight.

A power conversion apparatus for vehicle use according to this invention is provided with: a plurality of semiconductor modules in which semiconductor devices are sealed with a resin, and each of which has a module body, an input terminal, and an output terminal; a heat sink of a rectangular parallelepiped shape which has cooling principal planes on its opposite surfaces, respectively, for cooling these semiconductor modules; and a plurality of control boards that are electrically connected to the semiconductor modules for controlling the driving of the semiconductor modules; wherein each of the semiconductor modules is arranged in such a manner that its module body has a principal plane in surface contact with one of the cooling principal planes of the heat sink, and each of the control boards is in opposition to a surface of said module body at an opposed side of said principal plane thereof.

According to the power conversion apparatus for vehicle use of this invention, each of said semiconductor modules is arranged such that the principal planes of its module body are in surface contact with said cooling principal planes of said heat sink, respectively, and each of said control boards is arranged in opposition to a surface of said module body at an opposed side of said principal plane thereof. With such an arrangement, it is possible to provide the power conversion apparatus which is small in size and light in weight.

BRIEF DESCRIPTION OF THE DRAWINGS

In the accompanying drawings:

FIG. 15 is a perspective view showing the smoothing capacitor module in FIG. 12;

DETAILED DESCRIPTION OF THE PREFERRED EMBODIMENTS

Figure 1:
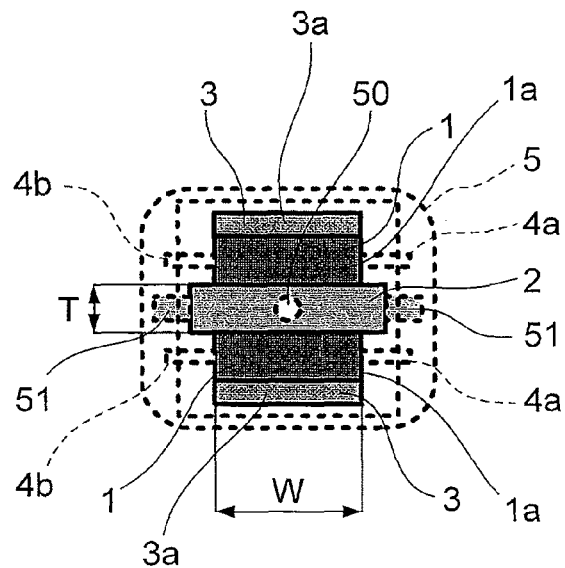
FIG. 1 is a construction explanatory view showing a power conversion apparatus for vehicle use of a first embodiment of the present invention.

Hereafter, respective embodiments of the present invention will be described, but the same or corresponding component members and parts in respective figures will be explained by attaching the same reference numerals or characters to them.

First Embodiment

Figure 2:
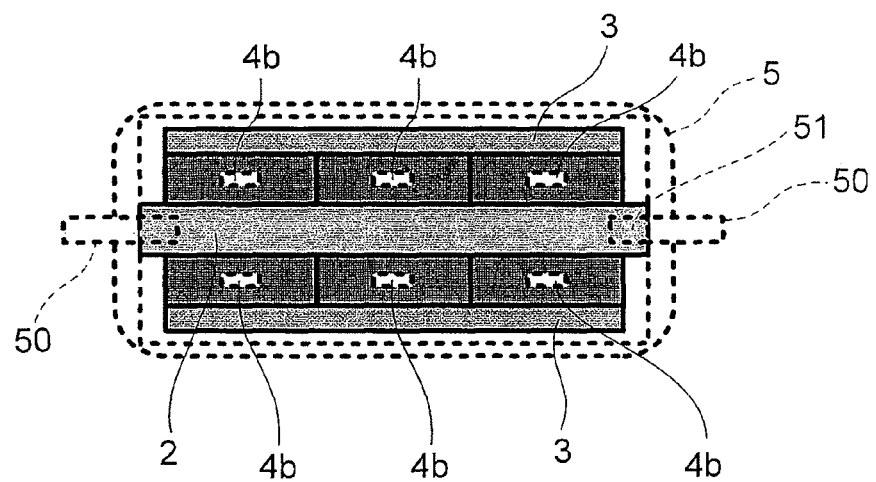
FIG. 2 is a side elevational view of FIG. 1.
Figure 3:
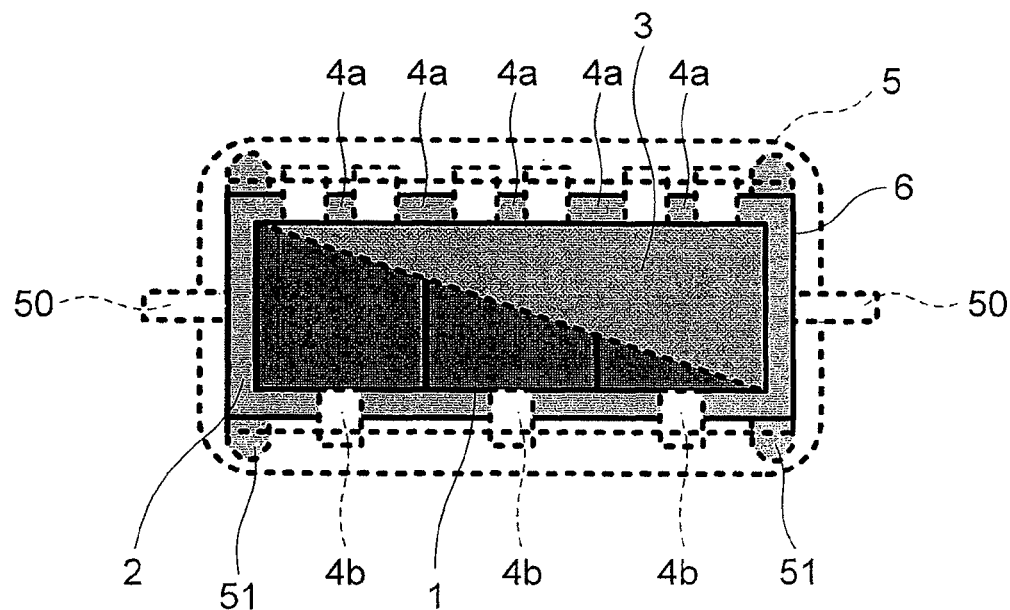
FIG. 3 is a plane view of FIG. 1.

FIG. 1 is a construction explanatory view showing a power conversion apparatus for vehicle use of a first embodiment of the present invention, FIG. 2 is a side elevational view of FIG. 1, and FIG. 3 is a plan view of FIG. 1.

This power conversion apparatus for vehicle use (hereinafter referred to simply as a power conversion apparatus) is provided with a plurality of semiconductor modules 1, a heat sink 2 of a rectangular parallelepiped shape that cools these semiconductor modules 1, and control boards 3 that control the driving of the semiconductor modules 1.

Each of the semiconductor modules 1 is provided with a module body 1a of a rectangular parallelepiped shape that is molded with a resin, input terminals 4a that protrude from one side surface of this module body 1a and are connected to a power source, an output terminal 4b that protrudes from the other side surface of the module body 1a arranged in opposition to the one side surface and are connected to a load, and signal terminals that protrude from the side surface of the module body 1a and are electrically connected to the control boards 3.

Each module body 1a has a pair of temperature detection units that each detect the temperature of a semiconductor chip, a pair of flowing current detection units that each detect a flowing current, a pair of IGBTs in the form of semiconductor devices for switching the current, and a pair of reflux diodes that are connected in anti-parallel to the IGBTs, respectively, wherein the two sets of these elements are connected in series to each other, and are sealed with a resin.

Three semiconductor modules 1 among all the six semiconductor modules 1 are arranged in such a manner that principal planes of their module bodies 1a (i.e., planes from which the input terminals 4a, the output terminals 4b and the signal terminals do not protrude, and the surface areas of which are the largest) at one side thereof are in surface contact with one cooling principal plane of the heat sink 2 (i.e., a plane of which the surface area is the largest), and are arranged adjacent and in line with one another.

The remaining three semiconductor modules 1 are also arranged in such a manner that their principal planes at one side thereof are in surface contact with the other cooling principal plane of the heat sink 2, and are arranged adjacent and in line with one another.

In addition, the cooling principal planes of the heat sink 2 are not subjected to cutting work, and have substantially the same degree of flatness as those of the principal planes of the module bodies 1a of the semiconductor module 1.

The above-mentioned pair of control boards 3 are arranged at the principal plane sides of the module bodies 1a at opposed sides of the heat sink 2, respectively.

The above-mentioned heat sink 2 is of a thin type having a thickness T smaller than the width W of each module body 1a (a distance between a side surface from which the input terminals 4a protrudes, and a side surface from which the output terminals 4b protrudes).

Moreover, the heat sink 2 has a pair of coolant ports 50 for entrance and exit of a cooling medium formed on its opposite side surfaces, respectively, which are vertical with respect to the cooling principal planes thereof.

Also, as can be seen from FIG. 3, the heat sink 2 is formed at its four corners with housing connection parts 51 which protrude toward the outside of the heat sink 2. The semiconductor modules 1, the heat sink 2 and the control boards 3, all of which are received in a housing 5, are fixedly secured to the housing 5 through these housing connection parts 51.

Figure 4:
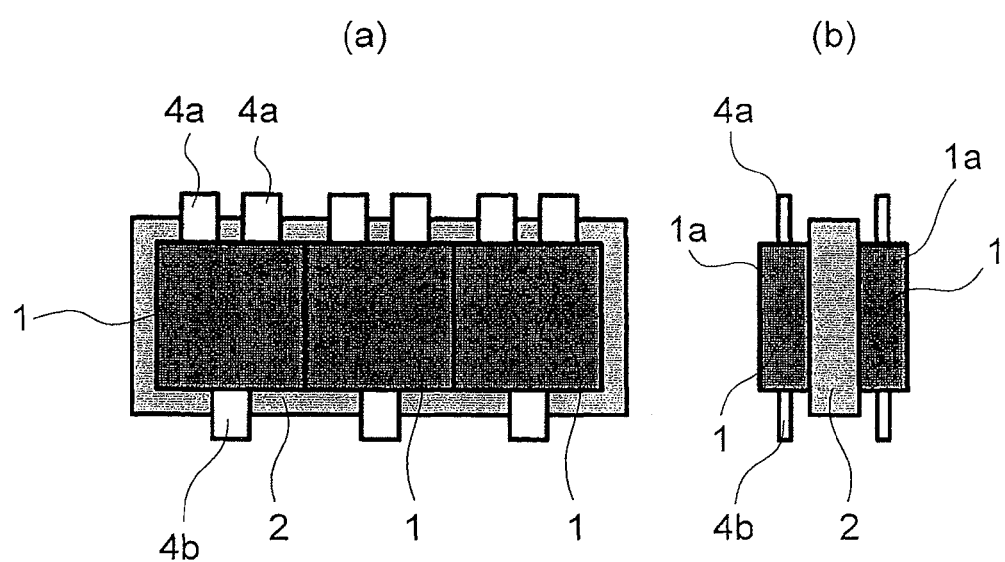
FIG. 4(a) is an explanatory view showing arrangement relation of a heat sink and semiconductor modules.
FIG. 4(b) is a side elevational view of FIG. 4(a)

According to the power conversion apparatus of this embodiment, as shown in FIGS. 4(a) and 4(b), the semiconductor modules 1 are arranged on the opposite cooling principal planes of the heat sink 2.

Figure 5:
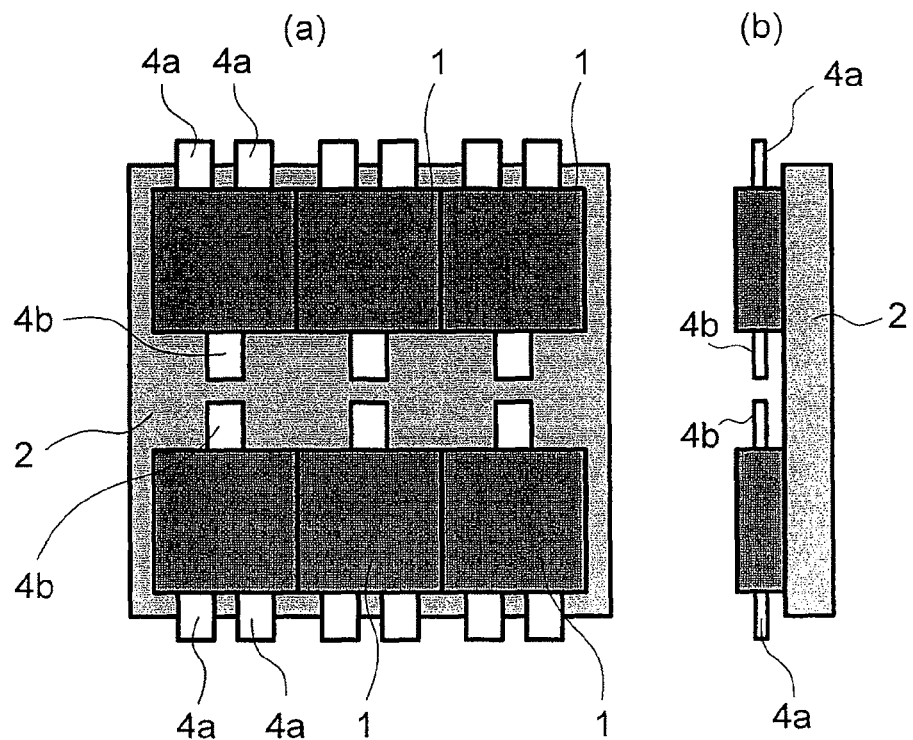
FIG. 5(a) is an explanatory view showing arrangement relation of a heat sink and semiconductor modules corresponding to a first prior art reference.
FIG. 5(b) is a side elevational view of FIG. 5(a)

Accordingly, as compared with the previously explained power conversion apparatus of the first prior art reference, as shown in FIGS. 5(a) and 5(b), the floor area occupied by the semiconductor modules 1 can be reduced by half, thus making it possible to achieve the miniaturization of the power conversion apparatus.

Figure 6:
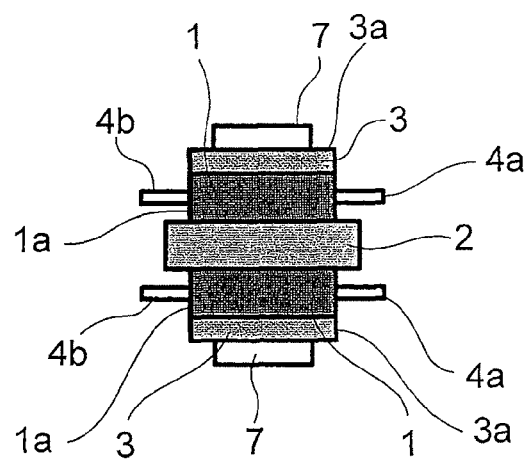
FIG. 6 is an explanatory view showing arrangement relation of a heat sink, semiconductor modules and control boards of FIG. 1.

In addition, as shown in FIG. 6, the control boards 3 having control circuit component parts 7 are arranged at the sides opposite to the principal planes of the semiconductor modules 1 with which the heat sink 2 are in contact.

Figure 7:
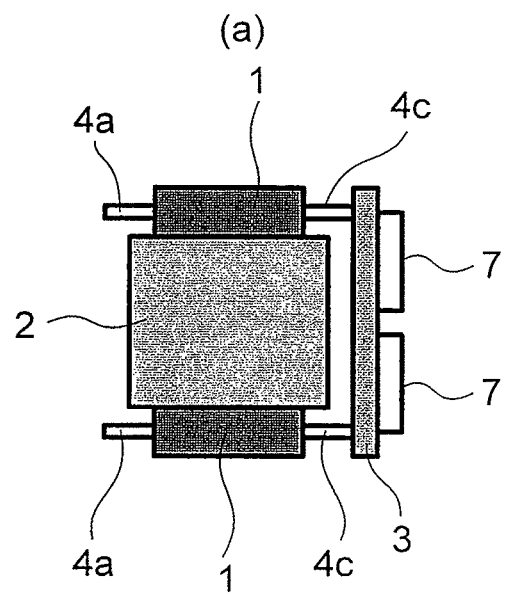
FIG. 7(a) is an explanatory view showing arrangement relation of a heat sink and semiconductor modules corresponding to a second prior art reference.
FIG. 7(b) is an explanatory view showing arrangement relation of the thin type heat sink in FIG. 7(a)
Figure 7:
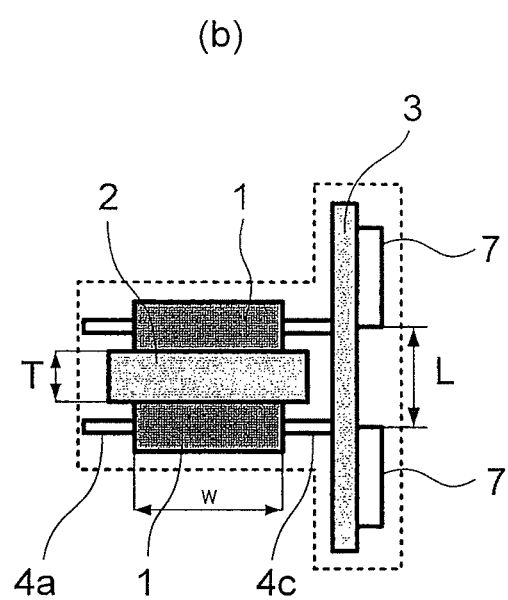

In the previously explained power conversion apparatus of the second prior art reference, as shown in FIGS. 7(a) and 7(b), a creepage distance L and a circuit mounting area on the control board 3 are affected by the thickness T of the heat sink 2. For example, in cases where the heat sink 2 of a very thin type is adopted in which the thickness T of the heat sink 2 is sufficiently smaller than the width W of each of the module bodies 1a of the semiconductor modules 1, it is difficult to secure the sufficient creepage distance L between the control circuit component parts 7 and the sufficient circuit mounting area on the control board 3.

On the other hand, in the power conversion apparatus of this embodiment, the thickness of the heat sink 2 can be made thin, without being affected by the influence of the working voltage and the circuit size of the power conversion apparatus of the control boards 3, and hence, combined with the reduction by half of the floor area occupied by the semiconductor modules 1, it is possible to achieve a substantial miniaturization of the power conversion apparatus.

Moreover, in the power conversion apparatus of the second prior art reference, as shown in FIG. 7(b), the overall shape of main component parts including the control boards 3 takes a partially protruded shape.

In contrast to this, in the power conversion apparatus of this embodiment, the module bodies 1a, the heat sink 2, and the board bodies 3a of the control boards 3 are each of a rectangular parallelepiped shape.

Accordingly, a main component part 6 of the power conversion apparatus, which is composed of the module bodies 1a, the heat sink 2 and the board bodies 3a, has an overall configuration of a rectangular parallelepiped shape, so the installability of the power conversion apparatus including the housing 5 to a vehicle is enhanced, and in addition to this, the power conversion apparatus can be fixedly secured to the housing 5 in an easy and robust way, thus making it possible to improve the vibration proof of the power conversion apparatus.

Further, the control boards 3 are arranged above the semiconductor modules 1, and the signal terminals protrude in a direction perpendicular to the direction of protrusion of the input terminals 4a and the output terminals 4b protruded from the module bodies 1a.

Accordingly, the signal terminals can be made short, and at the same time, the most part of the signal terminals can be arranged in a substantially horizontal direction with respect to the magnetic field generated in accordance with the operation of the semiconductor modules 1. As a result, the magnetic flux generated from the semiconductor modules 1 linked to the signal terminals can be reduced, and the number of parts required for noise countermeasure can be made small, thus making it possible to achieve the miniaturization and cost reduction of the power conversion apparatus.

In addition, the cooling principal planes of the heat sink 2 are in contact with the bottom surfaces, i.e., the principal planes of the module bodies 1a of the semiconductor modules 1, respectively, with the degree of flatness comparable with that of the bottom surfaces, without the need of subjecting the cooling principal planes of the heat sink 2 to cutting work, so the contact thermal resistance on the contact surfaces can be reduced, thereby making it possible to improve the heat dissipation of the semiconductor modules 1.

There is an effect which this brings about the miniaturization and cost reduction of the heat sink 2 or the semiconductor modules 1, and makes entire the power conversion apparatus small size and low cost by extension.

Next, detailed reference will be made to the structure of the above-mentioned heat sink 2 based on FIGS. 8(a) and 8(b).

Figure 8:
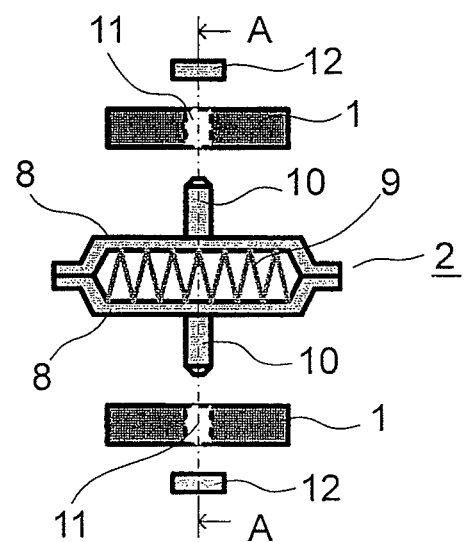
FIG. 8(a) is a view explaining joining or bonding between the heat sink and the semiconductor modules of FIG. 1.
FIG. 8(b) is an arrow cross sectional view along line A-A in FIG. 8(a)
Figure 8:
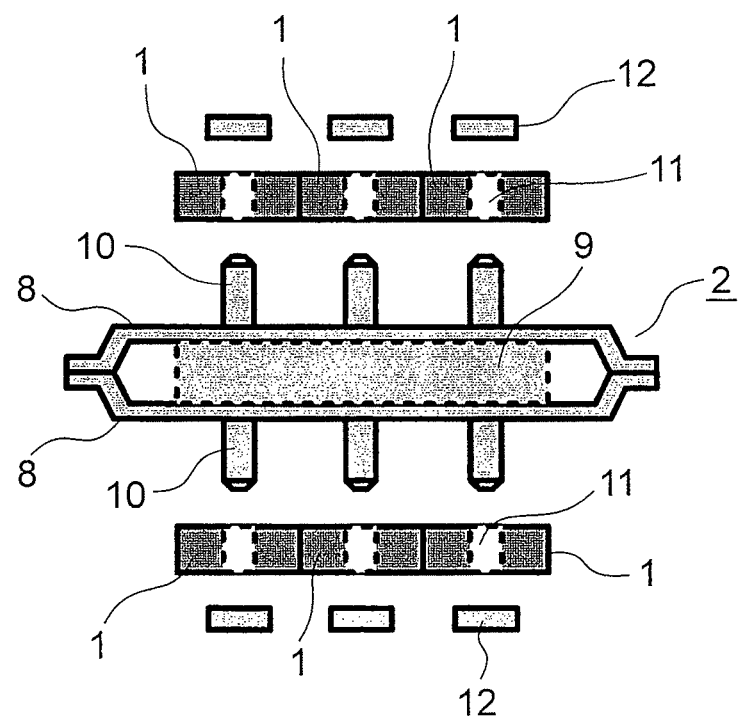

FIG. 8(a) is a view explaining joining or bonding between the heat sink 2 and the semiconductor modules 1 of FIG. 1, and FIG. 8(b) is an arrow cross sectional view along line A-A in FIG. 8(a).

This heat sink 2 is provided with a pair of top plates 8 which constitute a heat sink body and which have edge portions formed in opposition to each other and joined or bonded to each other by brazing, a cooling fin 9 which is arranged inside the top plates 8 made of metal for increasing a contact area with the cooling medium, and the coolant ports 50 becomes an entrance and an exit for the cooling medium. Here, note that the top plates 8 and the cooling fin 9, which are brazed with each other, are metal structure bodies, respectively.

Moreover, three stud bolts 10 are joined by brazing to the opposite cooling principal planes of the top plates 8, respectively, which are in surface contact with the principal planes of the module bodies 1a of the semiconductor modules 1. Each of these stud bolts 10 has a tip end portion passed through a hole 11 which is formed through a corresponding module body 1a, and a nut 12 is threadedly fitted to a corresponding stud bolt 10 so that each semiconductor module 1 is fixedly secured to the heat sink 2.

Figure 10:
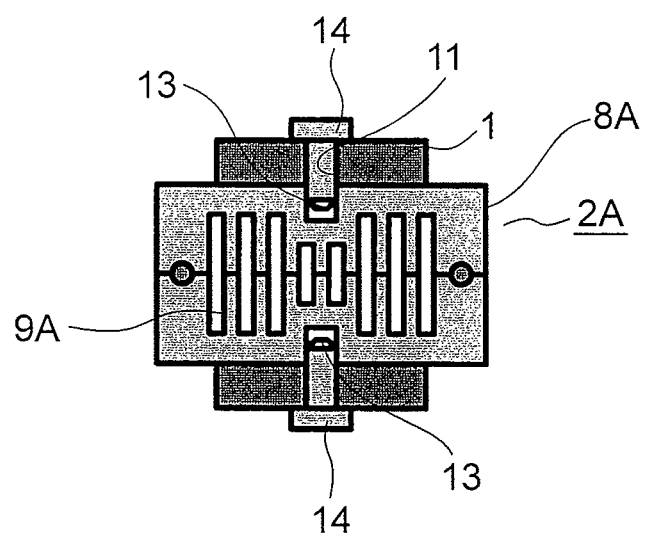
FIG. 10 is a cross sectional view of a heat sink that is manufactured by casting, extrusion molding.
Figure 11:
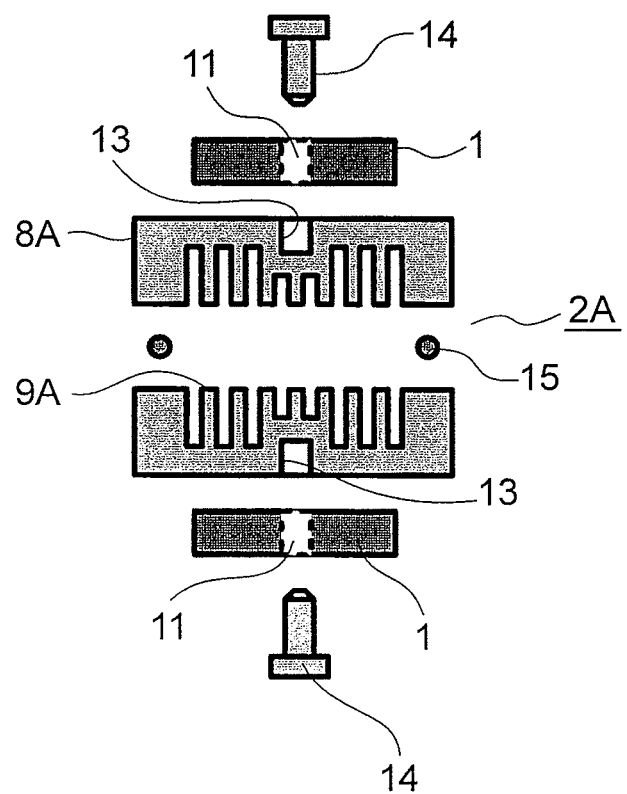
FIG. 11 is an exploded view of FIG. 10.

FIGS. 10 and 11 are cross sectional views of a heat sink 2A that is manufactured by casting, extrusion molding, or the like.

In the heat sink 2A manufactured by any of these techniques, in order to form fins 9A of large heat dissipation areas which are excellent in cooling capability, it is necessary to make thick not only the fins 9A but also top plates 8A due to various restrictions such as a molten metal flow at the time of casting, the strength of a mold used for extrusion, etc.

In addition, it is necessary to increase the length of the fins 9A so as to secure a sufficient contact area between the fins 9A and the cooling medium.

Moreover, in the casting or extrusion molding, in order to arrange the semiconductor modules 1 at the opposite sides of the heat sink 2A, it has been necessary to mold two or more component parts and assemble them through a seal member or unit 15 which serves to prevent the leakage of the cooling medium.

Figure 9:
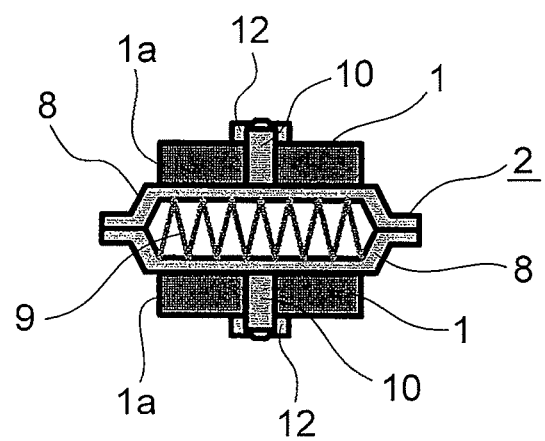
FIG. 9 is a construction explanatory view showing the heat sink of FIG. 1.

In contrast to this, according to the heat sink 2 of this embodiment, as shown in FIG. 9, the heat sink 2 of a thin type with a hollow flow passage can be manufactured in an easy manner, thus making it possible to miniaturize the power conversion apparatus.

Further, in FIGS. 10 and 11, the semiconductor modules 1 and the heat sink 2A are fixedly secured to each other by threadedly engaging the bolts 14, which are passed through the holes 11 in the semiconductor modules 1, with the internal threads 13 formed in the top plates 8A.

Accordingly, in order to form the internal threads 13 of a predetermined length so as to obtain a required fixing strength, it is necessary to make the top plates 8A thick, and from this point of view, too, slimming of the heat sink 2A has been difficult. On the other hand, according to the heat sink 2 of this embodiment, as shown in FIG. 9, the stud bolts 10 are formed upright on the opposite sides of the top plates 8, and the semiconductor modules 1 can be pressed and fixed to the heat sink 2 by threadedly fitting the nuts 12 over the tip end portions of the stud bolts 10, respectively.

That is, it is not necessary to produce the internal threads 13 of high strength for fixed fastening of the semiconductor modules 1 to the heat sink 2A, and hence the heat sink 2 can be made into a thin or slim shape, whereby the power conversion apparatus can be miniaturized.

In addition, the brazed joint of the stud bolts 10 to the top plates 8 can be carried out together with the brazed joining of the edges of the pair of the top plates 8. In the manufacturing process of the heat sink 2, an additional process for the addition of the stud bolts 10 becomes unnecessary, so the heat sink 2 of a thin type can be manufactured in an easy manner.

Here, note that each of FIGS. 1, 2 and 6 is an explanatory view, and in actuality, the semiconductor modules 1 and the control boards 3 are apart from each other.

Second Embodiment

Next, reference will be made to a power conversion apparatus of a second embodiment of the present invention, but in the following description, focus is placed on a construction different from that of the power conversion apparatus of the first embodiment.

Figure 12:
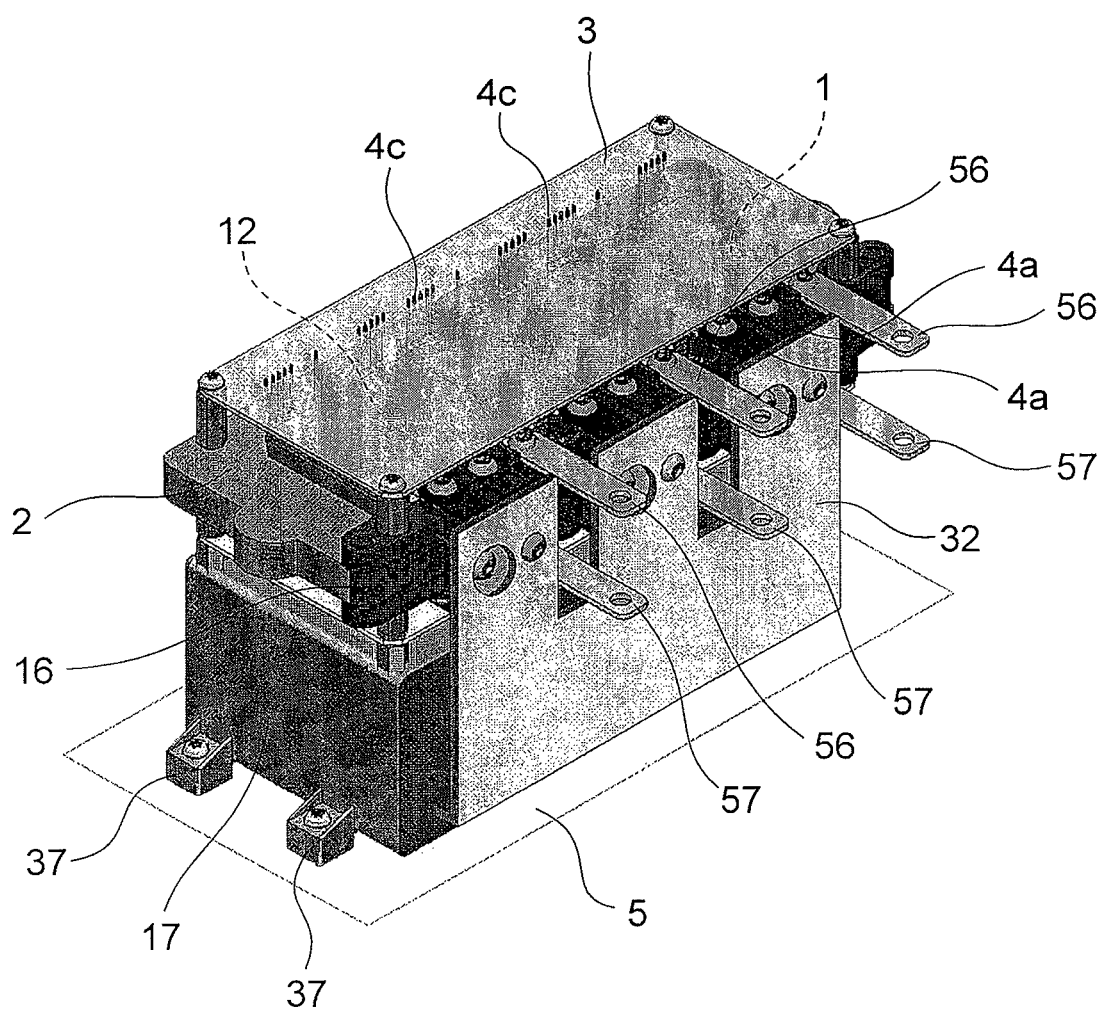
FIG. 12 is a perspective view showing the interior of the power conversion apparatus of the second embodiment of the present invention.
Figure 13:
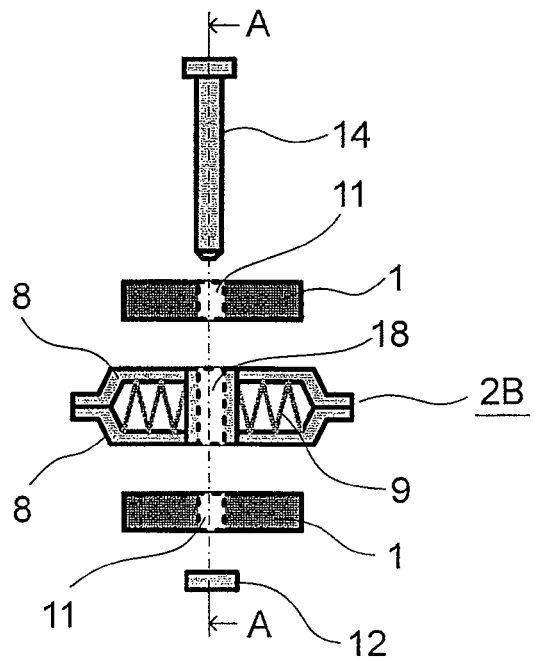
FIG. 13(a) is a view explaining coupling between the heat sink and semiconductor modules of FIG. 12.
FIG. 13(b) is an arrow cross sectional view along line A-A in FIG. 13(a)
Figure 13:
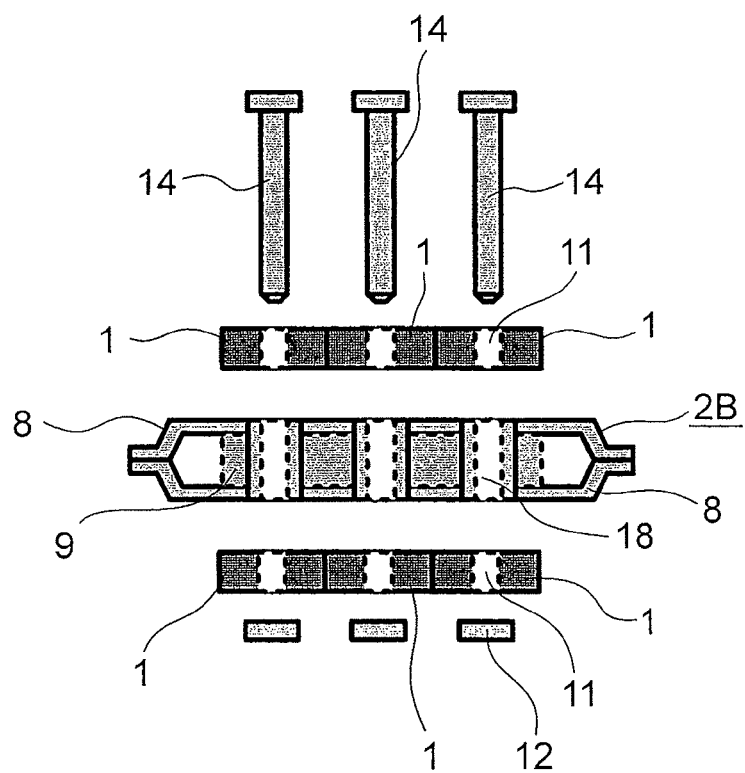
Figure 14:
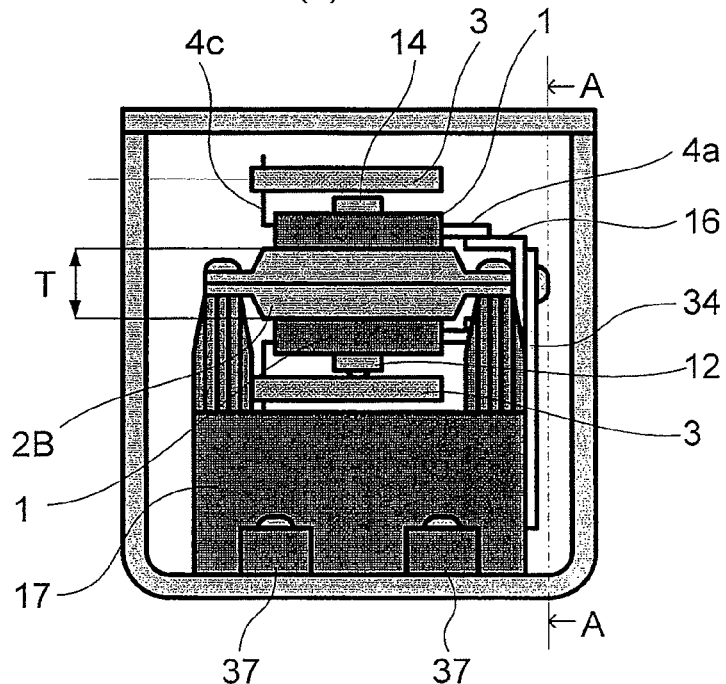
FIG. 14(a) is a cross sectional view showing the power conversion apparatus of FIG. 12.
FIG. 14(b) is an arrow cross sectional view along line A-A in FIG. 14(a)
Figure 14:
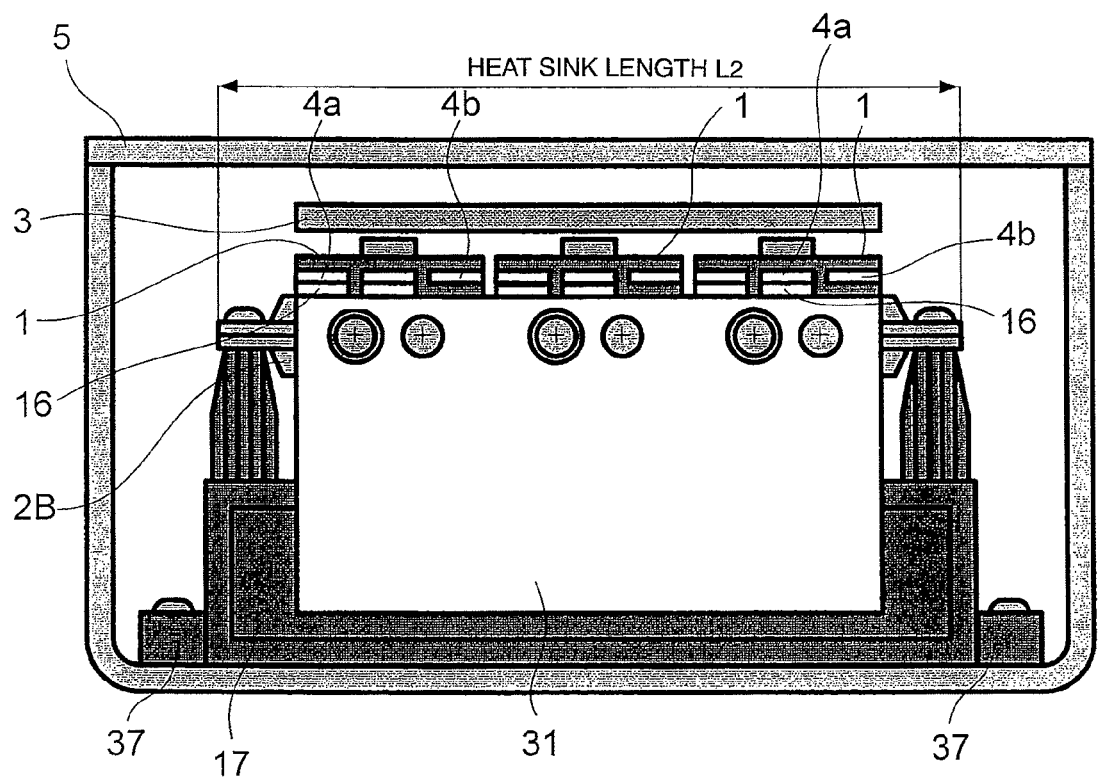

FIG. 12 is a perspective view showing the interior of the power conversion apparatus of the second embodiment of the present invention. FIG. 13(a) is a view explaining coupling between a heat sink 2B and semiconductor modules 1 of FIG. 12, and FIG. 13(b) is an arrow cross sectional view along line A-A in FIG. 13(a). FIG. 14(a) is a cross sectional view showing the power conversion apparatus of FIG. 12, and FIG. 14(b) is an arrow cross sectional view along line A-A in FIG. 14(a).

In the power conversion apparatus of this embodiment, each of the semiconductor modules 1 has a hole 11 formed therethrough substantially in the center thereof. The heat sink 2B has a plurality of holes 18 formed therethrough at its locations facing the holes 11 in the semiconductor modules 1.

A pair of semiconductor modules 1 and the heat sink 2B are fixedly secured to each other with the opposite cooling principal planes of the heat sink 2B being in surface contact with the principal planes of the semiconductor modules 1, respectively, by threadedly fitting a nut 12 over a tip end portion of a bolt 14 which passes through the holes 11, 18.

As the heat sink 2 of the first embodiment, which is fixedly coupled or fastened to the semiconductor modules 1 by the use of the stud bolts 10, there can be used a heat sink which is thinner than that in the conventional power conversion apparatus.

However, the strength of the stud bolts 10 is decreased due to hot heating thereof at the time when the stud bolts 10 are joined by brazing to the top plates 8, so in cases where it is necessary to strongly press and fix the semiconductor modules 1 to the heat sink 2, it is difficult to secure a required degree of strength, as a result of which the plurality of stud bolts 10 have to be used, and hence an accordingly large joining space is needed, thus making it difficult to miniaturize the power conversion apparatus.

In contrast to this, in the power conversion apparatus of the second prior art reference, each pair of semiconductor modules 1 and the heat sink 2B are fixedly secured to each other by threadedly fitting a nut 12 to a tip end portion of a bolt 14 which passes through the holes 11, 18. As a result, the reduction in the strength of the stud bolts 10 due to hot heating at the time of brazing as in the first embodiment does not occur, so it is possible to fasten the semiconductor modules 1 to the heat sink 2B in a space required for joining by the use of a minimum number of bolts, i.e., 14 bolts.

For this reason, in cases where it is necessary to press and fix the semiconductor modules 1 to the heat sink 2B in a firm or strong manner, a large joining space is not required, thus making it possible to miniaturize the power conversion apparatus.

In addition, in the power conversion apparatus of the second embodiment of the present invention, a smoothing capacitor module 17 is received in a housing 5 (only a bottom surface thereof being shown in FIG. 12), the smoothing capacitor module 17 being connected to the input terminals 4a of the semiconductor modules 1 for smoothing the input voltage of semiconductor modules 1. As a smoothing capacitor, a film capacitor is applied, for example.

Figure 15:
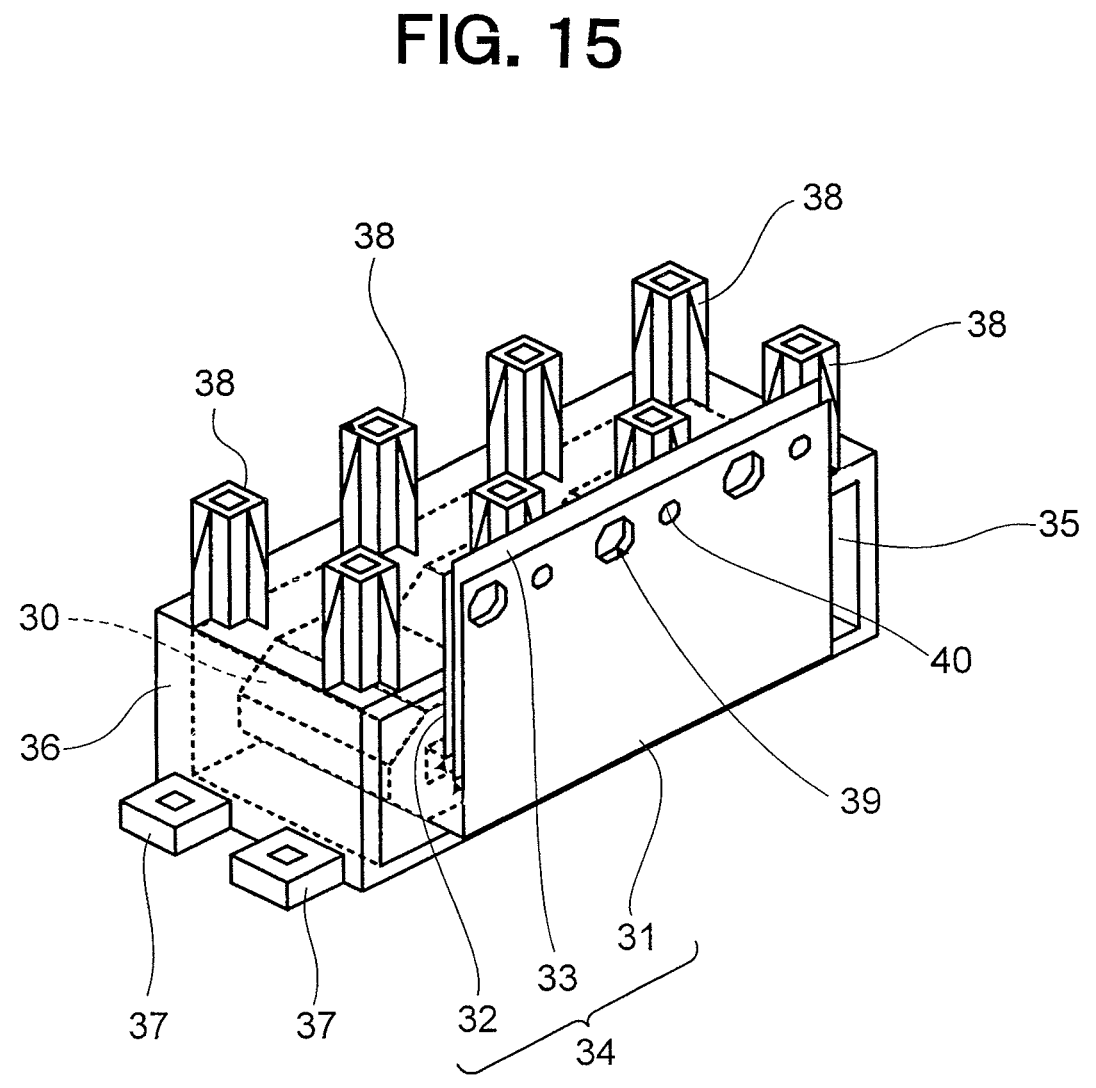

This smoothing capacitor module 17 is provided with a plurality of film capacitor devices 30, and a low inductance terminal 34 that connects the plurality of film capacitor devices 30 and a terminal block 16 to each other, the terminal block 16 serving to fix the input terminals 4a of semiconductor modules 1, as shown in FIG. 15.

The low inductance terminal 34 is constructed such that a positive electrode plate 31 and a negative electrode plate 32 are arranged adjacent to each other through an insulating material 33 therebetween.

In addition, the smoothing capacitor module 17 is provided with a box-shaped case 36 that has an opening portion 35 formed at a side of the low inductance terminal 34, a plurality of mounting legs 37 that are integrally formed with the case 36 for connecting the case 36 and the housing 5 to each other, and a plurality of heat sink attachment parts 38 that are integrally formed with the case 36 for connecting the case 36 and the heat sink 2B to each other, wherein the film capacitor devices 30, which are arranged in the case 36, and terminals are sealed or encapsulated with a resin so that they are united with the case 36.

This smoothing capacitor module 17 is fixedly fastened to the housing 5 at four mounting legs 37 by means of fastening members.

In addition, the smoothing capacitor module 17 is fixedly attached to the heat sink 2B at eight heat sink attachment parts 38 by means of fastening members, and is arranged in the close proximity to an undersurface of a lower side one of a pair of control boards 3.

In the heat sink 2B of the above-mentioned first embodiment, the semiconductor modules 1 are mounted on the opposite cooling principal planes of the heat sink 2, respectively, and hence, the power conversion apparatus can be miniaturized by making the heat sink 2B thin or slim.

However, in cases where the heat sink 2B is further made into a much thinner shape so as to make the power conversion apparatus small in size, the thickness T of the heat sink 2B is smaller with respect to the length L2 of the heat sink 2B (the distance between the opposed side surfaces thereof from which the input terminals 4a and the output terminals 4b do not protrude), and hence the rigidity in the lengthwise direction of the heat sink 2B is low, as a result of which there is a possibility that the heat sink 2B may be changed due to an external force such as the vibration applied at the time of the actual use of the power conversion apparatus.

However, according to the power conversion apparatus of this second embodiment, the heat sink 2B is joined or fastened through the plurality of heat sink attachment parts 38 to the smoothing capacitor module 17, which is higher in rigidity than the heat sink 2B and in which the film capacitor devices 30 are sealed with the resin in the box-shaped case 36 having a cross section larger than that of the heat sink 2B. As a result, deformation of the heat sink 2B is prevented, thus improving the vibration proof thereof.

Here, note that the present invention can be applied even to the heat sink 2B which is arranged below the smoothing capacitor module 17.

Moreover, the semiconductor modules 1, the heat sink 2B and the control boards 3, being integral with one another, are fixedly secured through the smoothing capacitor module 17 to the housing 5 by means of the mounting legs 37, and hence, upon assembly of the power conversion apparatus, it is possible to assemble the power conversion apparatus by using the smoothing capacitor module 17 as a base.

As a result of this, even in specifications in which the shape of the housing 5 becomes complicated due to the restriction of the mounting locations of the housing 5, there is no affect on the assembly method of the power conversion apparatus and the main component parts of the power conversion apparatus, and it becomes possible to achieve improvements in the versatility of the power conversion apparatus, reduction in the cost due to the diversion of component parts and assembly facilities, and the shortening of the development cycle.

Figure 16:
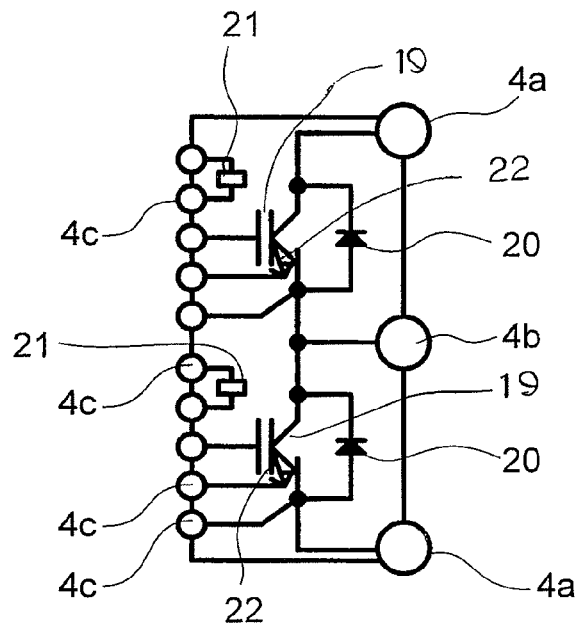
FIG. 16 is a circuit connection view showing the semiconductor module of the power conversion apparatus for vehicle use in FIG. 12.

In addition, similar to the semiconductor modules 1 of the first embodiment, the semiconductor modules 1 of this second embodiment is constructed of a pair of first and second groups of the following component elements, which are connected in series to each other and sealed with a resin, as shown in FIG. 16. Each of the first and second groups includes a temperature detection unit 21 that detects the temperature of a semiconductor chip, a flowing current detection unit 22 that detects a flowing current, an IGBT 19 that is a power semiconductor device for switching a current, and a FWDi (Free Wheeling Diode) 20 that is connected in anti-parallel to the IGBT 19.

In addition, each of the semiconductor modules 1 is formed substantially in the center thereof with a hole 11 that is used for fixing thereof to the heat sink 2B.

However, unlike the semiconductor modules 1 of the first embodiment, the input terminals 4a and the output terminals 4b are arranged on the same side surface of each module body 1a, respectively, and the signal terminals 4c are arranged on a side surface of each module body 1a opposite to the side surface on which the input terminals 4a and the output terminals 4b are arranged.

According to the semiconductor modules 1 of this second embodiment, like the first embodiment, one three-phase inverter is composed of three semiconductor modules 1 arranged at one side of the heat sink 2B, and hence, two three-phase inverters for driving two loads are constructed on the opposite sides of the heat sink 2B.

Figure 17:
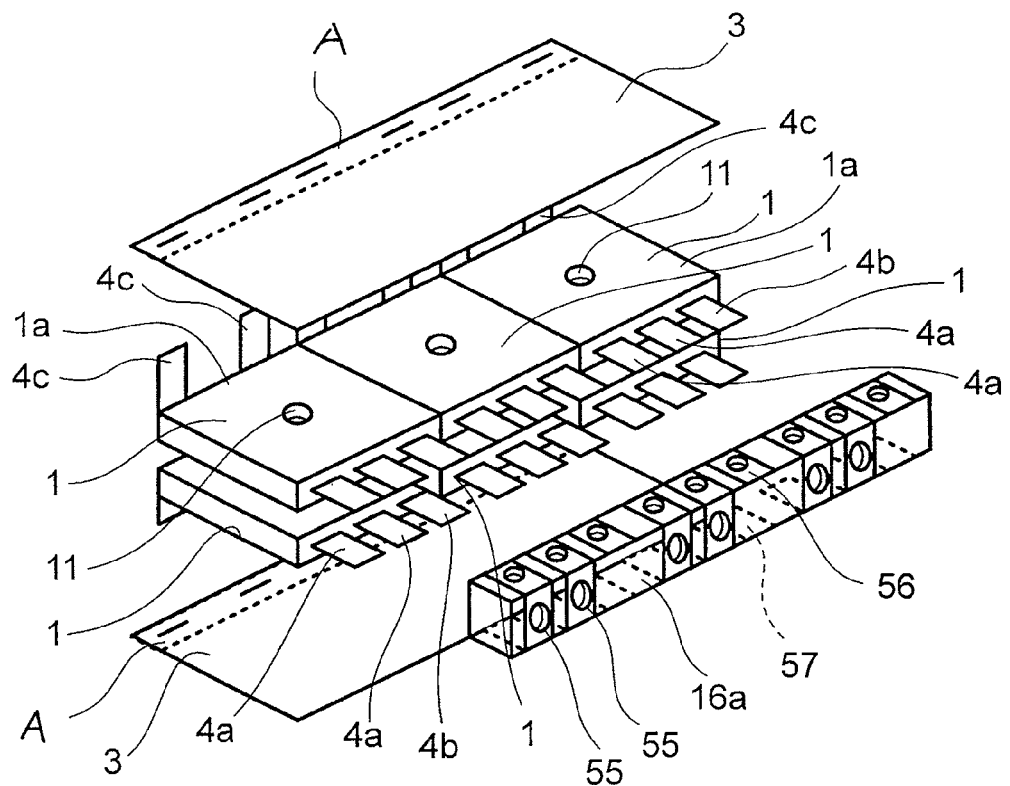
FIG. 17 is an exploded perspective view showing the control boards, the semiconductor modules and the terminal block in the power conversion apparatus for vehicle use of FIG. 12 (in case of driving two loads)
Figure 18:
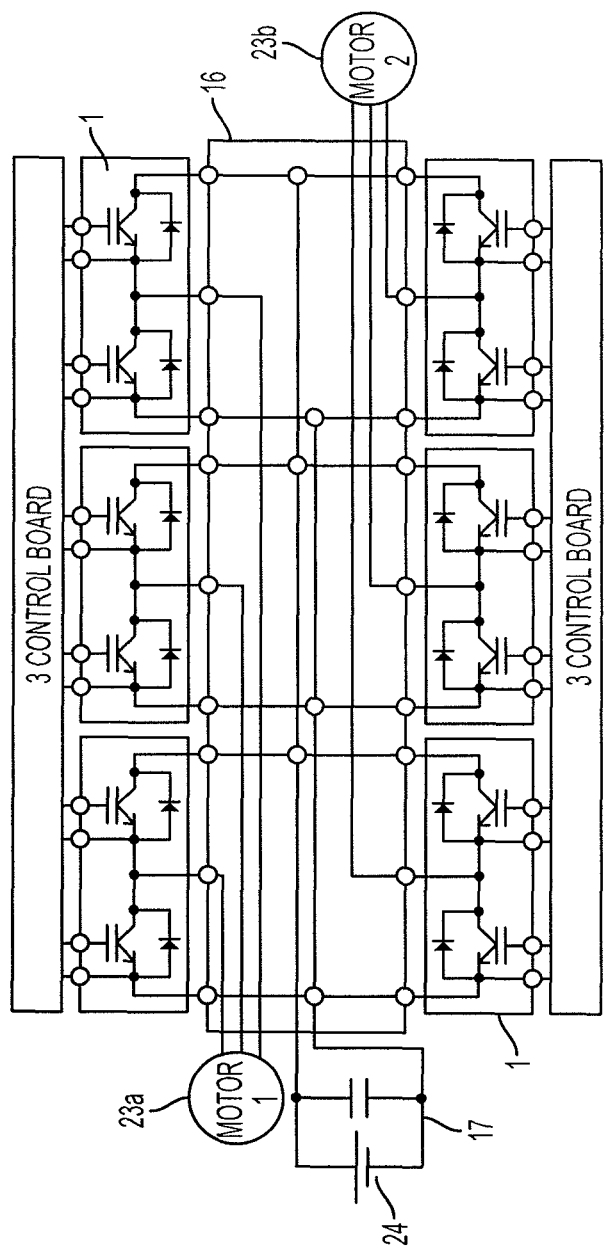
FIG. 18 is a circuit connection view in the power conversion apparatus for vehicle use of FIG. 12 (in case of driving two loads, in addition, a temperature detection unit and a flowing current detection unit of the semiconductor module are omitted)

FIG. 17 is an exploded perspective view showing the control boards 3, the semiconductor modules 1 and the terminal block 16 in the power conversion apparatus for vehicle use of FIG. 12, and FIG. 18 is a circuit connection view in the power conversion apparatus for vehicle use of FIG. 12.

In this power conversion apparatus, a first load 23a and a second load 23b are electrically connected to each other through a power source 24, the smoothing capacitor module 17 and the semiconductor modules 1, so that the driving of the first load 23a and the second load 23b is controlled by means of the six semiconductor modules 1.

In addition, the input terminals 4a and the output terminals 4b are arranged on one surface of the power conversion apparatus, so one terminal block 16 capable of handling a large current, which is used for connecting between the input terminals 4a and the terminals of the smoothing capacitor module 17, and between the output terminals 4b and a first load connection terminal 56 and a second load connection terminal 57, need only be used for the two three-phase inverters together. As a result, compared with the semiconductor modules 1 of the first embodiment in which the input terminals 4a and the output terminals 4b are arranged in mutually different directions, respectively, the reduction in the number of component parts can be made.

Here, note that a reference numeral 55 denotes connection terminals for connecting the smoothing capacitor module 17 to the terminal block 16.

In addition, those portions in which the control boards 3 and the signal terminals 4c of the semiconductor modules 1 are connected with each other by means of soldering are concentrated or collected in a location A at one side of the control boards 3, as shown in FIG. 17, as a result of which it becomes possible to achieve the miniaturization of the control boards 3 and hence the miniaturization of the power conversion apparatus due to the reduction in an area in which component parts can not be mounted by restrictions on improvements in assembly efficiency or soldering operation.

Figure 19:
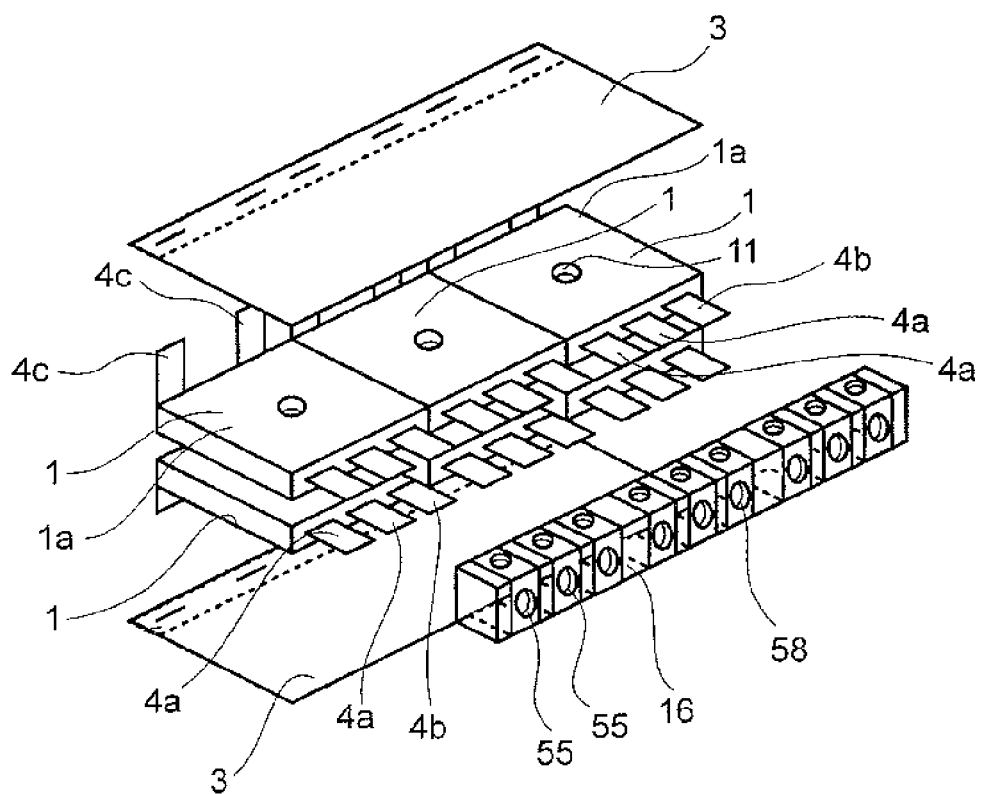
FIG. 19 is an exploded perspective view showing the control boards, the semiconductor modules and the terminal block in the power conversion apparatus for vehicle use of a second embodiment of the present invention in case of driving a single load of a single large load.
Figure 20:
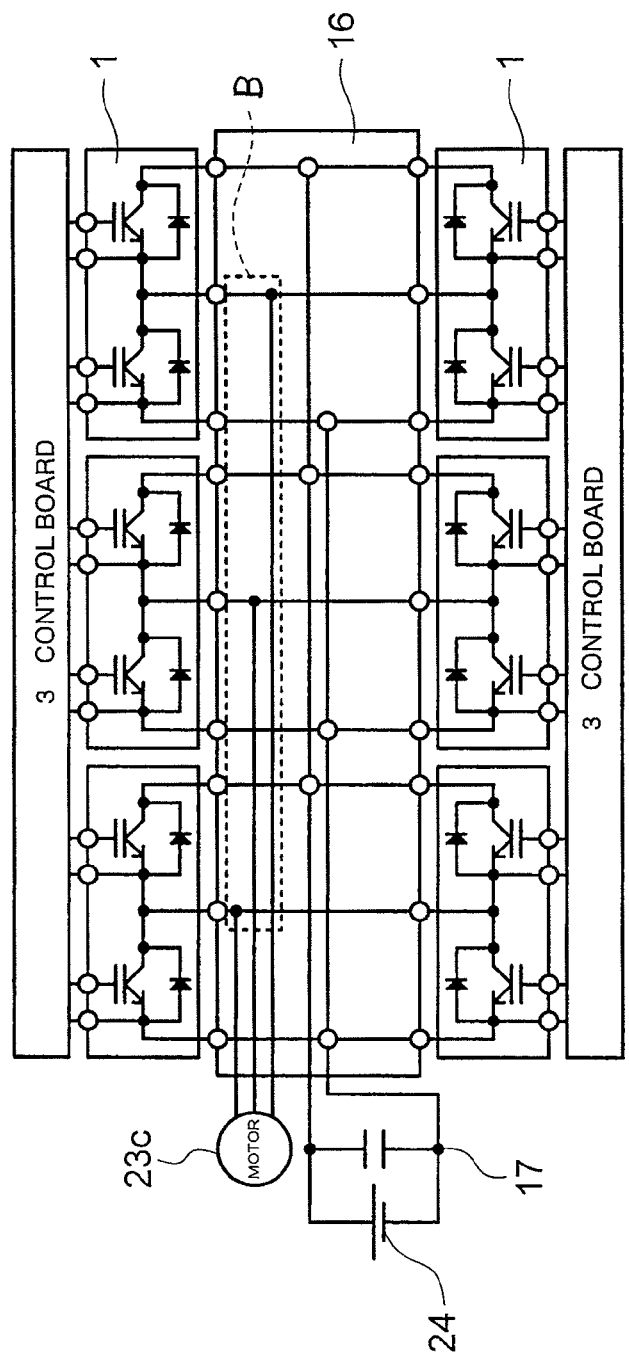
FIG. 20 is a circuit connection view in the power conversion apparatus for vehicle use of FIG. 19 (in case of driving a single load of a single large load, in addition, a temperature detection unit and a flowing current detection unit of the semiconductor module are omitted)

Here, note that by changing the terminal construction inside of the terminal block 16 to rearrange the connections between semiconductor modules 1 and a power source 24 and a load 23c, as shown in FIG. 19 and FIG. 20, thereby to make the semiconductor modules 1 into a parallelization (see a reference character B in FIG. 20), it is also possible to change the power conversion apparatus into a single large load one which controls the single load 23c of a single large load connected through the output terminals 4b and a load connection terminal 58.

According to the semiconductor modules 1 of this embodiment, all the input terminals 4a and the output terminals 4b of the semiconductor modules 1 are collected and connected to the one terminal block 16. With this arrangement, the addition and reduction of new or existing component parts as well as the change of assembly processes accompanying a change in the specification of the power conversion apparatus, the addition of a new model, etc., can be made small, and it becomes possible to achieve improvements in the versatility of the power conversion apparatus, reduction in the cost due to commonality of component parts, and the shortening of the development cycle.

Third Embodiment

Next, reference will be made to a power conversion apparatus of a third embodiment of the present invention.

In the following description, focus is placed on a construction different from that of the power conversion apparatus of the second embodiment.

Figure 21:
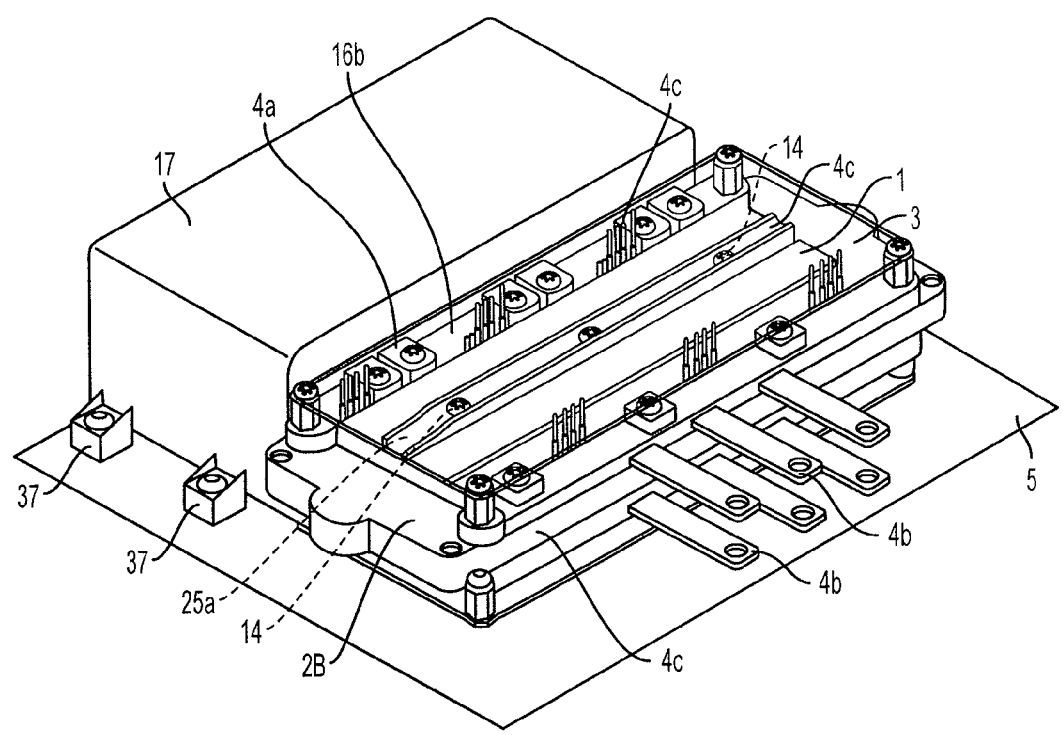
FIG. 21 is a perspective view showing the interior of the power conversion apparatus of the third embodiment of the present invention.
Figure 22:
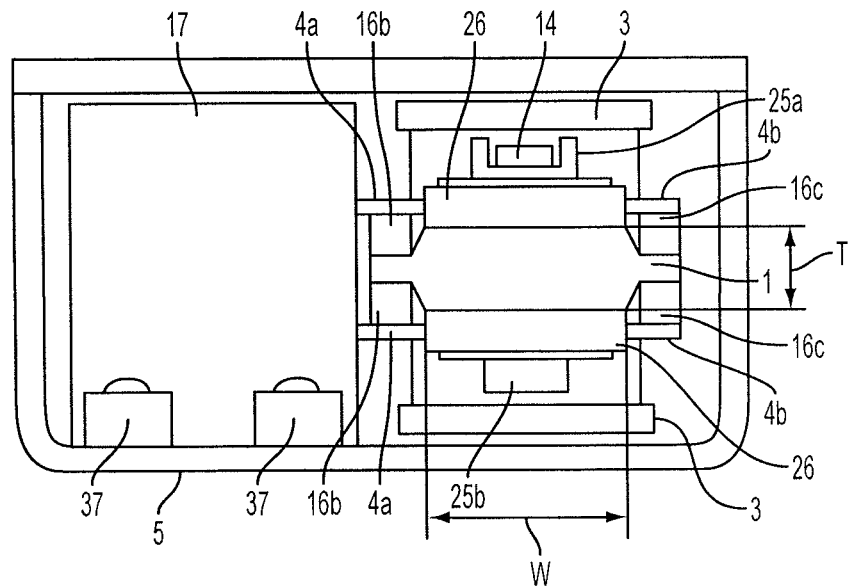
FIG. 22 is a cross sectional view showing the power conversion apparatus for vehicle use of FIG. 21.

FIG. 21 is a perspective view showing the interior of the power conversion apparatus of the third embodiment of the present invention, and FIG. 22 is a cross sectional view showing the power conversion apparatus for vehicle use of FIG. 21.

In the power conversion apparatus of this third embodiment, each of semiconductor modules 1 has a hole 11 formed therethrough substantially in the center thereof. A heat sink 2B has a hole 18 formed therethrough in its portion facing this hole 11. A pair of three sets of semiconductor modules 1 are arranged on the opposite sides of the heat sink 2B, respectively. A reinforcement beam 25a of a channel-shaped cross section extending in a lengthwise direction of the heat sink 2B is mounted through a holddown spring 26 on the semiconductor modules 1 at an upper surface side of the heat sink 2B.

A reinforcement beam 25b extending in a lengthwise direction of the heat sink 2B is mounted through a holddown spring 26 on the semiconductor modules 1 at a lower surface side of the heat sink 2B.

A pair of semiconductor modules 1 and the heat sink 2B are fixedly secured to each other with the opposite cooling principal planes of the heat sink 2B being in surface contact with the principal planes of semiconductor modules 1, respectively, by threadedly fitting the tip end portion of each bolt 14, which passes through a hole in the upper reinforcement beam 25a, a hole in the upper holddown spring 26, a hole 11 in an upper semiconductor module 1, a hole 18 in the heat sink 2B, a hole 11 in a lower semiconductor module 1, and a hole in the lower holddown spring 26, into the lower reinforcement beam 25b.

In the power conversion apparatus of this embodiment, an axial force or tension of each bolt 14 is distributed through the reinforcement beams 25a, 25b in the lengthwise direction of the heat sink 2B by means of the holddown springs 26, the reinforcement beam 25a having a hole structure, and the reinforcement beam 25b having a internal thread structure, and it is further distributed in the direction of the width W of the semiconductor modules 1 by means of the holddown springs 26, whereby the semiconductor modules 1 are pressed against the heat sink 2B in a much firmer and stronger manner.

In addition, by the use of the internal thread structure formed in the reinforcement beam 25b in place of the nuts 12 of the second embodiment, the unification of the nuts 12 and the reduction in the number of component parts are carried out.

Moreover, in the semiconductor modules 1 of this third embodiment, the input terminals 4a and signal terminals 4c are arranged on one side surface of the pair of side surfaces of each semiconductor module 1 substantially vertical to a principal plane surface thereof which is in contact with a corresponding cooling principal plane of the heat sink 2B, and the output terminals 4b and signal terminals 4c are arranged on the other side surface of each semiconductor module 1 opposite to the one side surface.

In addition, the smoothing capacitor module 17, being arranged at one side of the heat sink 2B, has its terminals directly connected to the input terminals 4a of the semiconductor modules 1.

According to the power conversion apparatus of this third embodiment, the input terminals 4a and the output terminals 4b are separately arranged at the opposite sides of the semiconductor modules 1, so the arrangement and shape of the input terminals 4a can be determined without being affected by the influence of the arrangement of the output terminals 4b.

Further, the smoothing capacitor module 17 is arranged in close proximity to the semiconductor modules 1, and the input terminals 4a of the semiconductor modules 1 and the terminal of the smoothing capacitor module 17 are directly connected to each other. With such an arrangement, it becomes possible to shorten the distances between the input terminals 4a and the smoothing capacitor module 17 to a substantial extent, as compared with the case in which the smoothing capacitor module 17 is arranged away from the semiconductor modules 1 as in the second embodiment.

In addition, by shortening the distances between the input terminals 4a of the semiconductor modules 1 and the terminals of the smoothing capacitor module 17, wiring inductance can be made small whereby it is also possible to decrease the switching surges generated at the time of switching of power semiconductor devices such as the IGBTs 19 in the semiconductor modules 1.

Moreover, in cases where the brocking voltage of the semiconductor modules 1 is large enough and switching surges can be permitted or tolerated, it becomes possible to achieve the reduction in the switching loss generated in the power semiconductor devices, by increasing the switching speed of the power semiconductor devices, as a result of which it becomes possible to achieve the miniaturization of the heat sink 2B or the miniaturization and cost reduction of the semiconductor modules 1, and hence, it also becomes possible to achieve the miniaturization of the power conversion apparatus as a whole.

Figure 25:
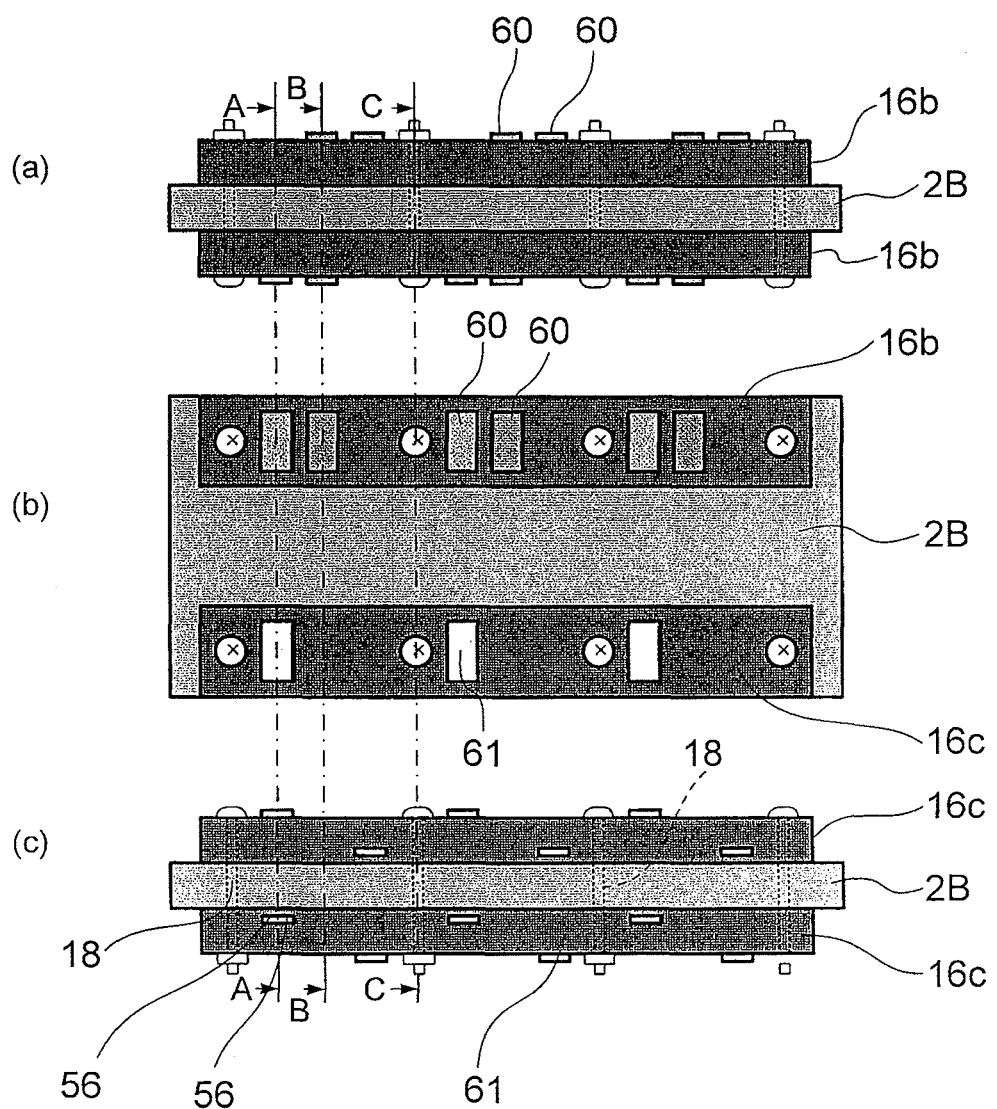
FIG. 25(a) is a view when seeing the terminal block from the input terminal block side in FIG. 21.
FIG. 25(b) is a plane view of the terminal block in FIG. 25(a)
FIG. 25(c) is a view when seeing the terminal block from the output terminal block side in FIG. 21
Figure 26:
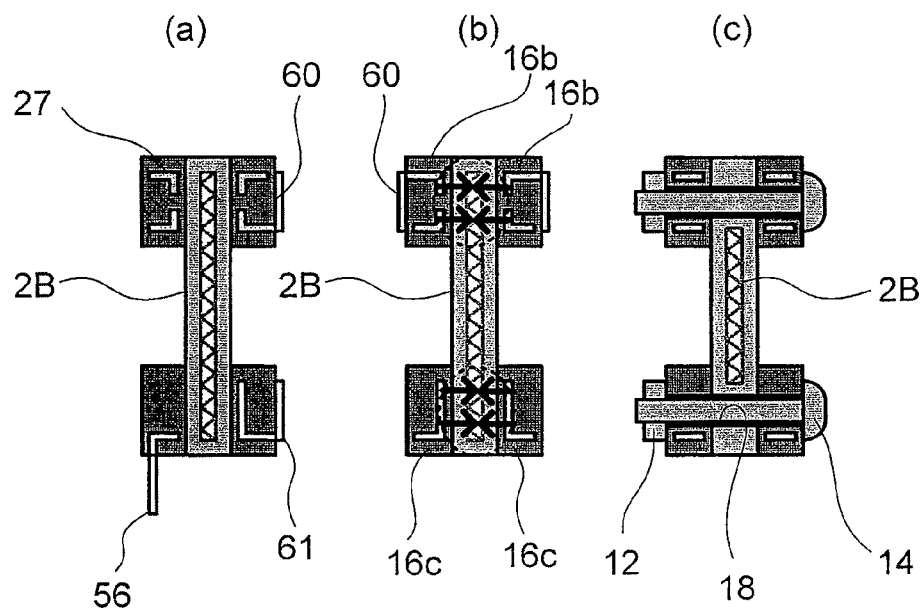
FIG. 26(a) is an arrow cross sectional view along line A-A in FIG. 25(a)
FIG. 26(b) is an arrow cross sectional view along line B-B in FIG. 25(a)
FIG. 26(c) is an arrow cross sectional view along line C-C in FIG. 25(a)

In addition, in the power conversion apparatus of this third embodiment, as shown in FIG. 25 and FIG. 26, a pair of input terminal blocks 16b adapted to be connected to the input terminals 4a are arranged on an edge portion of the heat sink 2B on the opposite sides thereof at the side of the smoothing capacitor module 17, so as to extend in the lengthwise direction of the heat sink 2B.

A pair of output terminal blocks 16c adapted to be connected to the output terminals 4b are arranged on an edge portion of the heat sink 2B on the opposite sides thereof at a side remote from the smoothing capacitor module 17, so as to extend in the lengthwise direction of the heat sink 2B.

The input terminal blocks 16b and the output terminal blocks 16c each have metal terminals 27 built therein, a part of the cross section of which is formed into a substantially L shape. Each of these metal terminals 27 is bent so that one side portion is arranged substantially in parallel to the cooling principal planes of the heat sink 2B and the other side portion is arranged substantially vertical to the cooling principal planes of the heat sink 2B.

Here, note that in FIGS. 25 and 26, a reference numeral 60 denotes input terminal connection parts, and a reference numeral 61 denotes output terminal connection parts.

In the power conversion apparatus of the second embodiment, the heat sink 2B, which is a thin shape and has a fear of decreased rigidity, is supported by the smoothing capacitor module 17 of high rigidity, but in contrast, in the power conversion apparatus of this third embodiment, the smoothing capacitor module 17 is arranged at one side of the heat sink 2B, so the reinforcement of the heat sink 2B by the smoothing capacitor module 17 can not be made.

In contrast to this, in the power conversion apparatus of this third embodiment, the rigidity in the lengthwise direction of the heat sink 2B is improved by arranging the terminal blocks 16b, 16c with the metal terminals 27 of substantially L shaped cross section built therein, on the opposite right and left side surfaces as well as on the opposite front and back side surfaces of the thin heat sink 2B along the lengthwise direction thereof.

With such an arrangement, the deformation of the thin heat sink 2B can be prevented, thereby making it possible to improve the vibration proof thereof. In addition, some portions of the metal terminals 27 inside the terminal blocks 16b, 16c are close to the heat sink 2B, so cooling of the metal terminal 27 can also be made.

Accordingly, it is possible to suppress the temperature rise of the metal terminals 27 due to the passage of electric current, and hence, it also becomes possible to achieve the miniaturization and cost reduction of the power conversion apparatus owing to the reduction in size of the cross-sectional areas of the metal terminals 27.

Figure 23:
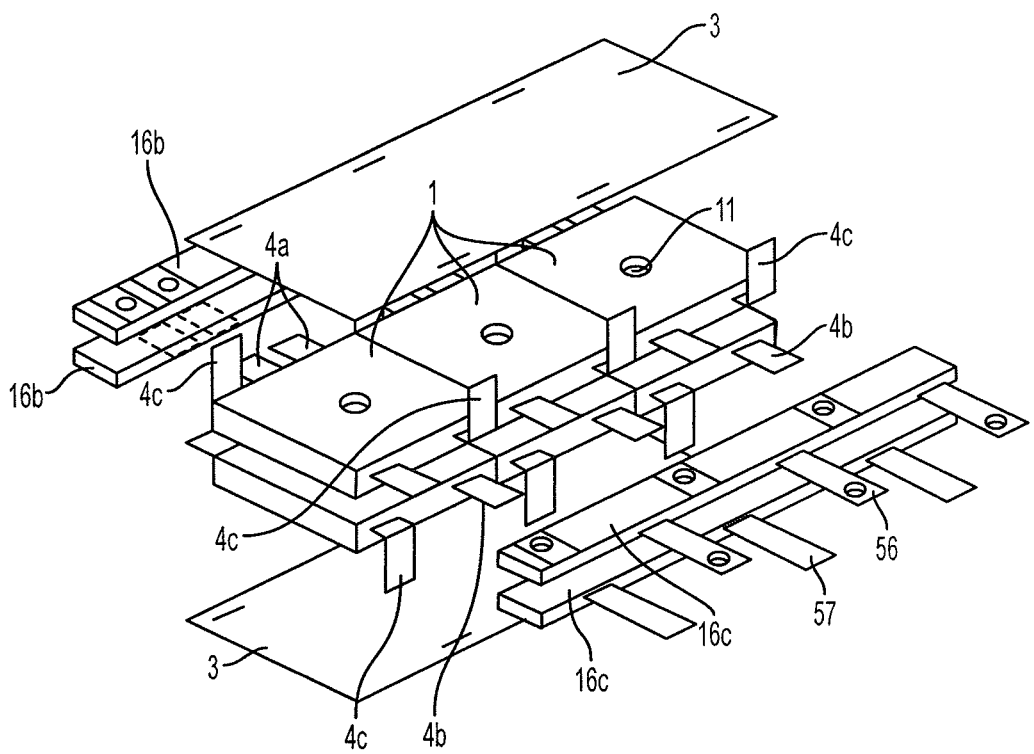
FIG. 23 is an exploded perspective view showing the control boards, the semiconductor modules and the terminal block in the power conversion apparatus for vehicle use of FIG. 21 (in case of driving two loads)
Figure 24:
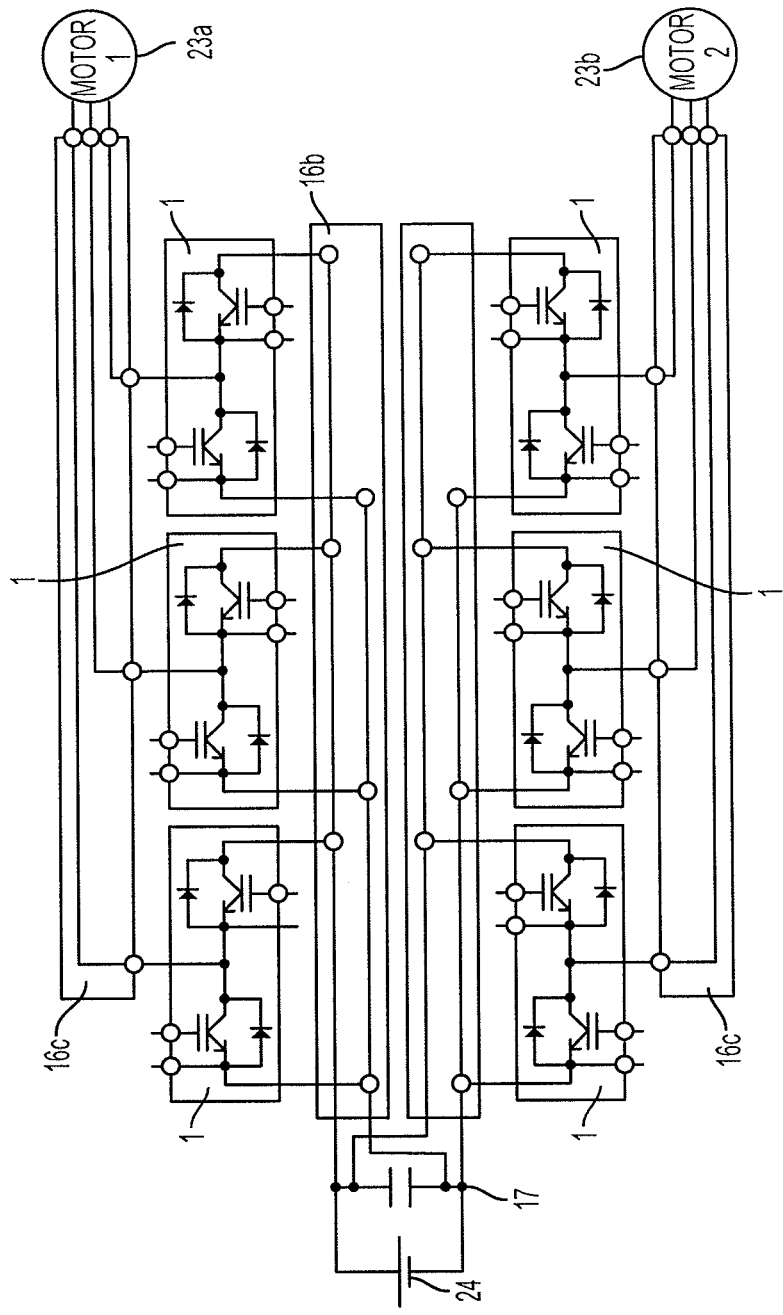
FIG. 24 is a circuit connection view in the power conversion apparatus for vehicle use of FIG. 21 (in case of driving two loads, in addition, a temperature detection unit and a flowing current detection unit of the semiconductor module are omitted)

Moreover, similar to the power conversion apparatus of the second embodiment, the power conversion apparatus of this third embodiment has six semiconductor modules 1 mounted thereon, and as shown in FIG. 23 and FIG. 24, in this power conversion apparatus, the driving of the first load 23a and the second load 23b is controlled by means of the six semiconductor modules 1.

Figure 27:
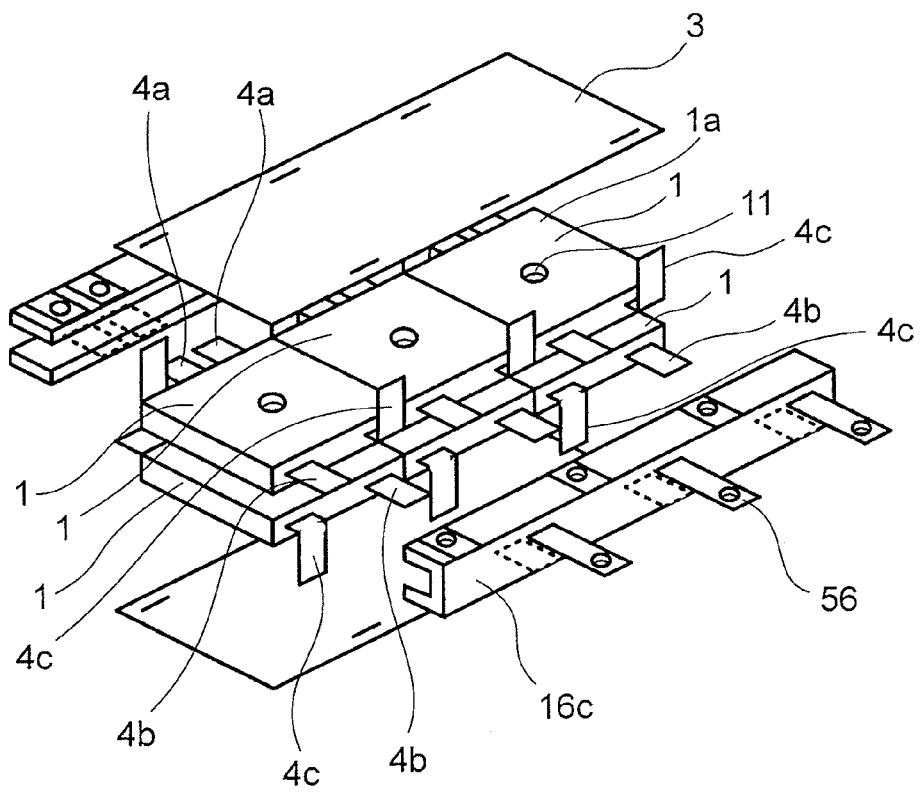
FIG. 27 is an exploded perspective view showing the control boards, the semiconductor modules and the terminal block in the power conversion apparatus for vehicle use of a third embodiment of the present invention (in case of driving a single load of a single large load)
Figure 28:
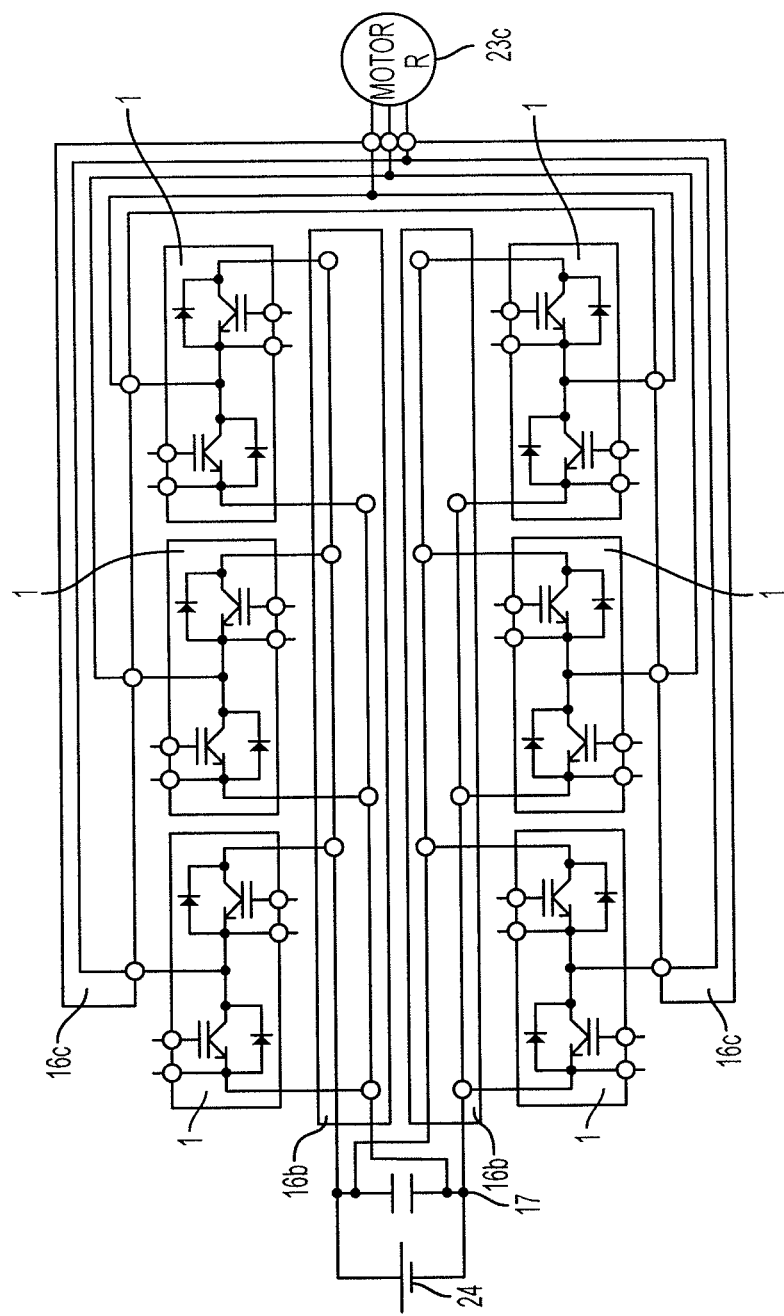
FIG. 28 is a circuit connection view in the power conversion apparatus for vehicle use of FIG. 27 (in case of driving a single load of a single large load, in addition, a temperature detection unit and a flowing current detection unit of the semiconductor module are omitted)
Figure 29:
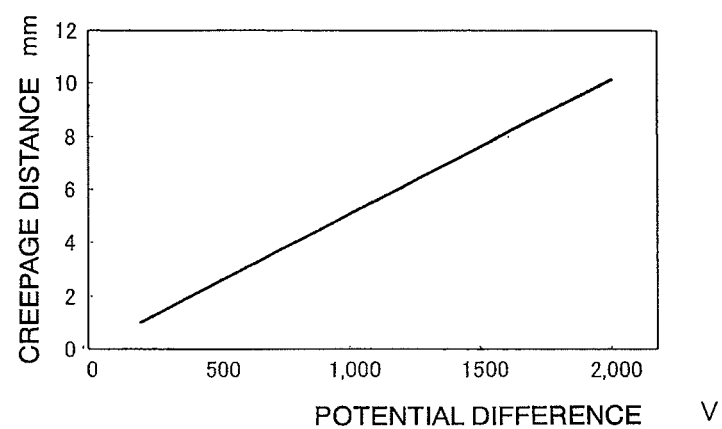
FIG. 29 is a view showing the required relation between the insulation creepage distance and the potential difference in the power conversion apparatus for vehicle use.

Here, note that by changing the terminal construction inside of the input terminal blocks 16b and the output terminal blocks 16c to rearrange the connections between the semiconductor modules 1 and the power source 24 and the load 23c, as shown in FIG. 27 and FIG. 28, thereby to make the semiconductor modules 1 into a parallelization, it is also possible to change the power conversion apparatus into a single large load one which controls the single load 23c of a single large load connected through the output terminals 4b and the load connection terminal 58.

In the semiconductor modules 1 of this third embodiment, the input terminals 4a and the output terminals 4b of the semiconductor modules 1 are respectively protruded in different directions from each other, as shown in FIG. 27, unlike the second embodiment, but the input terminals 4a are arranged collectively or intensively at the side surface of one side of semiconductor modules 1, and hence, even if component parts for the input terminal blocks 16b and the smoothing capacitor module 17 can be diverted for a power conversion apparatus of any construction.

According to this, improvements in the versatility of the power conversion apparatus, the reduction in the cost due to the diversion of component parts, and the shortening of the development cycle are not inferior as compared with the power conversion apparatus of the second embodiment, and the same effects as those in the second embodiment can be obtained in the third embodiment, too.

What is claimed is:

1. A power conversion apparatus for vehicle use comprising:
   a plurality of semiconductor modules in which semiconductor devices are sealed with a resin, and each of which has a module body, an input terminal, and an output terminal;
   a heat sink of a rectangular parallelepiped shape which has cooling principal planes on opposite surfaces thereof, respectively, for cooling these semiconductor modules; and
   a plurality of control boards which are electrically connected to the semiconductor modules for controlling the driving of said semiconductor modules;
   wherein each of said semiconductor modules is arranged in such a manner that its module body has a principal plane in surface contact with one of said cooling principal planes of said heat sink;
   each of said control boards is arranged in opposition to a surface of said module body at an opposed side of said principal plane thereof;
   wherein the heat sink is in between the semiconductor modules; and
   wherein said heat sink has a thickness which is smaller than a width between a first side surface of said module body from which said input terminal protrudes, and a second side surface of said module body opposite to said first side surface.

2. The power conversion apparatus for vehicle use as set forth in claim 1, wherein an overall shape of the power conversion apparatus is a rectangular parallelepiped shape.

3. The power conversion apparatus for vehicle use as set forth in claim 1, wherein said heat sink is composed of a plurality of metal structures joined to one another by brazing.

4. The power conversion apparatus for vehicle use as set forth in claim 1, wherein principal plane of said module body has a degree of flatness equal to that of said cooling principal planes of said heat sink.

5. The power conversion apparatus for vehicle use as set forth in claim 1, wherein a stud bolt for fixedly fastening said semiconductor modules is formed upright on each of said cooling principal planes of said heat sink.

6. The power conversion apparatus for vehicle use as set forth in claim 1, wherein said heat sink has a hole for fixedly fastening said semiconductor modules.

7. The power conversion apparatus for vehicle use as set forth in claim 1, wherein said input terminal and said output terminal are arranged at one side surface of said heat sink.

8. The power conversion apparatus for vehicle use as set forth in claim 1, wherein said input terminal is arranged at one side surface of the opposite side surfaces of said heat sink, and said output terminal is arranged at the other side surface of said heat sink opposite to said one side surface thereof.

9. The power conversion apparatus for vehicle use as set forth in claim 1, wherein said heat sink is fixedly secured to a smoothing capacitor module that smoothes an input voltage of said semiconductor modules arranged above or below said cooling principal planes of said heat sink.

10. The power conversion apparatus for vehicle use as set forth in claim 1, wherein smoothing capacitors for smoothing an input voltage of said semiconductor modules are arranged in parallel in a direction along said cooling principal planes of said heat sink.

11. The power conversion apparatus for vehicle use as set forth in claim 1, wherein a terminal block having a metal terminal molded with a resin is arranged at a side surface of said heat sink, and this terminal block is fixedly secured to said heat sink.

\* \* \* \* \*